(12) United States Patent
Yamazaki et al.

(10) Patent No.: US 7,371,623 B2
(45) Date of Patent: May 13, 2008

(54) SEMICONDUCTOR DEVICE WITH SEMICONDUCTOR CIRCUIT COMPRISING SEMICONDUCTOR UNITS, AND METHOD FOR FABRICATING IT

(75) Inventors: Shunpei Yamazaki, Setagaya (JP); Etsuko Fujimoto, Sagamihara (JP); Atsuo Isobe, Atsugi (JP); Toru Takayama, Atsugi (JP); Kunihiko Fukuchi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/438,818

(22) Filed: May 16, 2003

(65) Prior Publication Data
US 2003/0211662 A1 Nov. 13, 2003

Related U.S. Application Data

(62) Division of application No. 10/124,373, filed on Apr. 18, 2002, now Pat. No. 6,586,766, which is a division of application No. 09/353,370, filed on Jul. 14, 1999, now Pat. No. 6,399,960.

(30) Foreign Application Priority Data
Jul. 16, 1998 (JP) .................. 10-202376

(51) Int. Cl.
*H01L 21/84* (2006.01)
(52) U.S. Cl. ........... 438/153; 438/163; 438/286; 438/305; 257/E29.279

(58) Field of Classification Search .......... 438/48, 438/66, 149, 150, 128, 151, 152, 157, 158, 438/160, 161, 162–163, 166, 153–154, 303, 438/305, 286, 595; 257/59, 72, E29.268, 257/E29.279
See application file for complete search history.

(56) References Cited

U.S. PATENT DOCUMENTS 4,766,471 A 8/1988 Ovshinsky et al.

(Continued)

FOREIGN PATENT DOCUMENTS
JP 62-145870 6/1987

(Continued)

*Primary Examiner*—Zandra V. Smith
*Assistant Examiner*—Toniae M Thomas
(74) *Attorney, Agent, or Firm*—Eric J. Robinson; Robinson Intellectual Property Law Office, P.C.

(57) ABSTRACT

The invention is to provide a high-productivity method for fabricating a TFT device having different LDD structures on one and the same substrate, and the TFT device. Specifically, the invention provides a novel TFT structure, and a high-productivity method for fabricating it. A Ta film or a Ta-based film having good heat resistance is used for forming interconnections, and the interconnections are covered with a protective film. The interconnections can be subjected to heat treatment at high temperatures (400 to 700° C.), and, in addition, the protective film serves as an etching stopper. In the peripheral driving circuit portion in the device, TFTs having an LDD structure are disposed in a self-aligned process in which is used side walls 126 and 127; while in the pixel matrix portion therein, TFTs having an LDD structure are disposed in a non-self-aligned process in which is used an insulator 125.

39 Claims, 11 Drawing Sheets

U.S. PATENT DOCUMENTS

| | | | |
|---|---|---|---|
| 5,170,244 A | | 12/1992 | Dohjo et al. |
| 5,289,030 A | * | 2/1994 | Yamazaki et al. .......... 257/410 |
| 5,451,551 A | | 9/1995 | Krishnan et al. |
| 5,495,121 A | * | 2/1996 | Yamazaki et al. .......... 257/384 |
| 5,508,209 A | * | 4/1996 | Zhang et al. ............... 438/162 |
| 5,569,936 A | * | 10/1996 | Zhang et al. ................. 257/66 |
| 5,643,826 A | | 7/1997 | Ohtani et al. |
| 5,698,902 A | | 12/1997 | Uehara et al. |
| 5,710,453 A | | 1/1998 | Bryant |
| 5,712,495 A | | 1/1998 | Suzawa |
| 5,714,786 A | | 2/1998 | Gonzalez et al. |
| 5,786,241 A | | 7/1998 | Shimada |
| 5,821,137 A | | 10/1998 | Wakai et al. |
| 5,846,871 A | | 12/1998 | Lee et al. |
| 5,856,689 A | | 1/1999 | Suzawa |
| 5,880,508 A | | 3/1999 | Wu |
| 5,897,344 A | | 4/1999 | Teramoto et al. |
| 5,914,498 A | | 6/1999 | Suzawa et al. |
| 5,923,961 A | | 7/1999 | Shibuya et al. |
| 5,923,970 A | | 7/1999 | Kirlin |
| 5,952,701 A | | 9/1999 | Bulucea et al. |
| 5,962,904 A | | 10/1999 | Hu |
| 5,986,312 A | | 11/1999 | Kuroda |
| 5,994,734 A | | 11/1999 | Chou |
| 5,998,841 A | | 12/1999 | Suzawa |
| 6,015,997 A | | 1/2000 | Hu et al. |
| 6,017,789 A | | 1/2000 | Sandhu et al. |
| 6,037,611 A | | 3/2000 | Jang et al. |
| 6,096,585 A | * | 8/2000 | Fukuda et al. ............... 438/154 |
| 6,121,652 A | | 9/2000 | Suzawa |
| 6,121,660 A | | 9/2000 | Yamazaki et al. |
| 6,133,620 A | | 10/2000 | Uochi |
| 6,144,082 A | | 11/2000 | Yamazaki et al. |
| 6,156,590 A | | 12/2000 | Yamazaki et al. |
| 6,218,219 B1 | | 4/2001 | Yamazaki et al. |
| 6,259,120 B1 | | 7/2001 | Zhang et al. |
| 6,274,887 B1 | * | 8/2001 | Yamazaki et al. ............. 257/72 |
| 6,297,093 B1 | * | 10/2001 | Borel et al. .................. 438/257 |
| 6,346,718 B1 | | 2/2002 | Yamanaka et al. |
| 6,388,270 B1 | | 5/2002 | Yamazaki et al. |
| 6,414,345 B1 | | 7/2002 | Suzawa |
| 6,482,684 B1 | | 11/2002 | Yamazaki |
| 6,518,594 B1 | * | 2/2003 | Nakajima et al. .............. 257/59 |
| 6,559,478 B1 | | 5/2003 | Suzawa et al. |
| 6,566,684 B1 | | 5/2003 | Suzawa |
| 6,605,497 B2 | | 8/2003 | Yamazaki et al. |
| 6,664,145 B1 | * | 12/2003 | Yamazaki et al. .......... 438/149 |
| 6,784,037 B2 | * | 8/2004 | Yamazaki et al. .......... 438/199 |
| 7,015,080 B2 | * | 3/2006 | Ishikawa .................... 438/151 |
| 7,161,178 B2 | | 1/2007 | Suzawa |

FOREIGN PATENT DOCUMENTS

| | | |
|---|---|---|
| JP | 63-316477 | 12/1988 |
| JP | 64-023575 | 1/1989 |
| JP | 06-088972 | 3/1994 |
| JP | 06-151853 | 5/1994 |
| JP | 06-232059 | 8/1994 |
| JP | 07-130652 | 5/1995 |
| JP | 07-321339 | 12/1995 |
| JP | 07-335903 | 12/1995 |
| JP | 08-116065 | 5/1996 |
| JP | 08-330602 | 12/1996 |
| JP | 09-246558 | 9/1997 |
| JP | 09-312260 | 12/1997 |
| JP | 10-051005 | 2/1998 |
| JP | 10-144929 | 5/1998 |
| JP | 10-163498 | 6/1998 |
| JP | 10-173200 | 6/1998 |

* cited by examiner

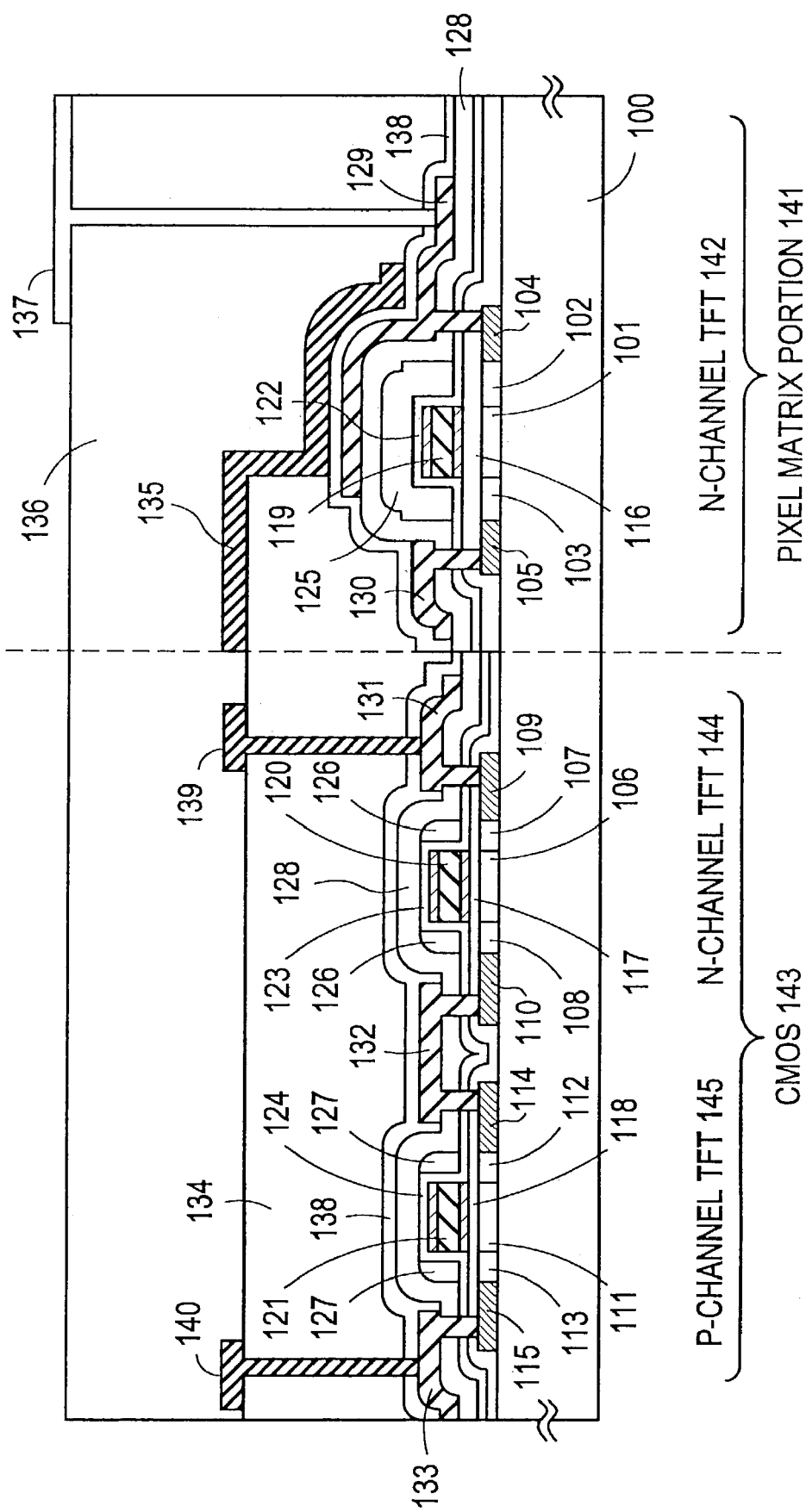

| P-CHANNEL TFT 145 | N-CHANNEL TFT 144 | N-CHANNEL TFT 142 |

CMOS 143        PIXEL MATRIX PORTION 141

P-CHANNEL TFT   N-CHANNEL TFT | N-CHANNEL TFT

CMOS | PIXEL TFT

P-CHANNEL   N-CHANNEL | N-CHANNEL

CMOS | PIXEL MATRIX PORTION

P-CHANNEL TFT   N-CHANNEL TFT   N-CHANNEL TFT

CMOS   PIXEL TFT

CONTACT PORTION   N-CHANNEL TFT / PIXEL TFT

SEMICONDUCTOR DEVICE WITH SEMICONDUCTOR CIRCUIT COMPRISING SEMICONDUCTOR UNITS, AND METHOD FOR FABRICATING IT

BACKGROUND OF THE INVENTION

1. Field of the Invention

The present invention relates to a semiconductor device having a semiconductor circuit that comprises a plurality of semiconductor units such as insulated gate transistors and the like, especially to that having a semiconductor circuit that comprises an active matrix unit (high withstand voltage circuit) and a logic circuit unit (high-speed driving circuit) for driving the active matrix unit both formed on one substrate, and also relates to a method for fabricating the semiconductor device. The semiconductor circuit to be constructed according to the invention may be on any insulation substrates of, for example, glass or the like, or on any insulation films as formed on semiconductor substrates of, for example, single-crystal silicon or the like.

In particular, the invention is especially favorable to and effective for semiconductor devices comprising a pixel matrix portion and a logic circuit for driving it, such as, liquid-crystal display devices, etc. The semiconductor device of the invention includes not only insulated gate transistors (semiconductor units) such as thin film transistors (TFTS), MOS transistors, etc., but also display devices having a semiconductor integrated circuit that comprises such semiconductor units, even further including electro-optical devices such as image sensors, etc. In addition, the semiconductor device of the invention still further includes electronic appliances incorporating any of those display devices and electro-optical devices.

2. Description of the Related Art

Active matrix-type liquid-crystal display devices are widely noticed in the art, which comprise a pixel matrix and a driving circuit comprising thin film transistors (TFTS) and the like as formed on an insulation substrate. Liquid-crystal panels having a size of from 0.5 to 20 inches or so are utilized as image-displaying panels.

One direction of liquid-crystalline display development is toward large-area display panels. In display devices having a large-area display panel, the pixel matrix to be the image-displaying portion shall have a large area and the source interconnections and also the gate interconnections as aligned in matrices in the circuit shall be long with the result that the circuit inevitably shall have increased interconnection resistance. In addition, the circuit must be patterned finer, for which the interconnection patterns shall be inevitably finer. Such finer interconnection patterns increase more the interconnection resistance. In each pixel, the source interconnection and the gate interconnection are connected with individual switching units such as TFTs and others. With the increase in the number of pixels, the incidental capacity increases, which, however, is problematic. In liquid-crystal display devices, in general, the gate interconnection pattern is integrated with the gate electrode pattern. In those, therefore, increasing the panel area often causes substantial gate signal delay.

If the materials constituting a gate interconnection have a lower resistivity, it is possible to modify the gate interconnection patterns to be finer and longer; therefore, enable large-area display panels. Al, Ta, Ti and the like have heretofore been used as the materials constituting the gate interconnection. Of those, Al is the most popular, as having a lowest resistivity and capable of being subjected to anodic oxidation. An oxide film as formed through anodic oxidation of Al has the advantage of improving the heat resistance of Al patterns coated with the oxide film. However, Al patterns are still problematic in that, even at a process temperature falling between 300° C. and 400° C. or so, they give whiskers and hillocks and are often deformed. In addition, Al readily diffuses into insulation films and active layers, thereby causing TFT operation failure, and TFT characteristics are much degraded by it.

For further enlarging the panel size of display devices and for ensuring finer patterning in fabricating them, needed are electrode structures having a much lower resistivity and better heat resistance.

Another direction of liquid-crystal display development is toward large scale integration of semiconductor units. For this, generally known is a peripheral driving circuit-integrated structure, for which a pixel matrix and a peripheral driving circuit are integrated and mounted on one and the same substrate. The peripheral driving circuit-integrated structure of that type has the advantages of low production cost and compact size.

As a rule, in an ordinary pixel matrix, either one of p-channel or n-channel thin film transistor (TFT) is disposed as a switching unit. A peripheral driving circuit for driving the pixel matrix comprises a logic circuit unit (high-speed driving circuit). One typical example of the peripheral driving circuit comprises a CMOS circuit unit composed of P-channel and N-channel TFTS.

For example, the TFTs disposed in the pixel matrix portion is required that each of the TFTs has a lower OFF current characteristic, because the pixel electrodes disposed in the pixel matrix portion is required to have a charge-retaining function.

On the other hand, the TFTs constituting the logic circuit disposed to be the peripheral driving circuit is required to operate quickly even at low current.

As in the above, the pixel matrix and the logic circuit differ from each other with respect to the necessary TFT characteristics for them. Therefore, it is desirable to prepare different TFT structures for the pixel matrix and the logic circuit and to fabricate the pixel matrix and the logic circuit by the use of those different TFT structures as separately prepared for them. However, the process of separately fabricating the pixel matrix and the logic circuit and integrating them is complex, and the yield in the process is low, and, in addition, the production costs are high. The complicated process to lower the yield and to increase the production costs is undesirable.

Given that situation, it is desired to form TFTs for the pixel matrix and those for the logical circuit all on one and the same substrate in a continuous process for fabricating peripheral driving circuit-integrated liquid-crystal display devices.

As one means for solving the problems noted above, known is a thin film transistor structure having an LDD (lightly doped drain) region. The LDD region is to relax the field strength to be formed between a channel forming region and a drain region, while lowering the OFF current in thin film transistors and preventing the thin film transistors from deteriorating. Having such an LDD region, thin film transistors ensure a lower OFF current characteristic.

In conventional techniques, the LDD region is formed from an anodic oxide film in a self-aligned process. However, the self-aligned process is not suitable for forming fine patterns, in which the patterned line width and the condition for anodic oxidation are difficult to control.

SUMMARY OF THE INVENTION

Given that situation in the art, the subject matter of the present invention is to provide a high-productivity method for forming plural TFTs each having a different LDD structure on one and the same substrate in a continuous manner, and to provide a semiconductor device having such plural TFTs on one and the same substrate. Specifically, the invention provides a novel TFT structure and a high-productivity method for producing it.

The first characteristic of the invention providing a novel semiconductor device structure is that the gate interconnections and the gate electrodes constituting TFT all have a multi-layered structure and are made from materials having good heat resistance. For example, a TaN film is first formed, then a Ta film is layered on it, and another TaN film is further layered on that Ta film to give a multi-layered structure in a continuous process, in which the multi-layered structure formed is coated with an inorganic film, typically with a protective film (having a thickness of from 10 to 100 nm) of silicon nitride.

The first aspect of the invention is a semiconductor device having a semiconductor circuit that comprises semiconductor units, wherein each semiconductor unit comprises;

a source region, a drain region, and a channel forming region between the source region and the drain region all formed on a substrate having an insulation surface, a gate insulation film formed on the channel forming region at least in contact with it, a gate electrode formed in contact with the gate insulation film, and a protective film at least covering the upper surface and the side surface of the gate electrode.

In the semiconductor device, preferably, the gate electrode has a multi-layered structure that comprises at least one layer consisting essentially of one element selected from tantalum, molybdenum, titanium, chromium and silicon.

More preferably, the gate electrode has a three-layered structure that comprises a first layer consisting essentially of tantalum with nitrogen, a second layer consisting essentially of tantalum, and a third layer consisting essentially of tantalum containing nitrogen, as layered in that order on the substrate.

Also preferably, the channel forming region contains an element capable of promoting silicon crystallization. More preferably, the concentration of the element is higher in the source region and in the drain region than in the channel forming region.

The second aspect of the invention is a semiconductor device having a semiconductor circuit that comprises semiconductor units, wherein each semiconductor unit comprises;

a source region, a drain region, and a channel forming region between the source region and the drain region all formed on a substrate having an insulation surface, a low-concentration dopant region formed between the source region and the channel forming region and between the drain region and the channel forming region, a gate insulation film formed at least on the channel forming region, a gate electrode formed above the channel forming region with being in contact with the gate insulation film, and a protective film at least covering the upper surface and the side surface of the gate electrode, and wherein;

the gate electrode has a three-layered structure that comprises a first tantalum layer containing nitrogen, a second tantalum layer and a third tantalum layer containing nitrogen as formed on the substrate in that order, the channel forming region contains an element capable of promoting silicon crystallization, and the concentration of the element is higher in the source region and in the drain region than in the channel forming region.

In the semiconductor device, preferably, the gate electrode is provided with an insulator on its upper surface and side surface via the protective film thereon, and the boundary between the low-concentration dopant region and the drain region and that between the low-concentration dopant region and the source region are determined by the insulator.

Also preferably, the gate electrode is provided with a side wall on its side surface via the protective film thereon, and the boundary between the low-concentration dopant region and the drain region and that between the low-concentration dopant region and the source region are determined by the side wall.

Still preferably, the gate electrode is provided with a side wall directly on its side surface, and the upper surface of the gate electrode and the side wall are covered with the protective film.

Further preferably, the source region and the drain region contain a dopant for N-type conductivity added thereto.

Again preferably, the source region and the drain region contain a dopant for N-type conductivity and a dopant for P-type conductivity added thereto.

Still again preferably, at least a part of the source region and the drain region is of a silicide.

The second characteristic of the invention is that the side wall is formed through anisotropic etching with forming the insulator (of which the size is larger than that of the side wall) via a mask. In the high-speed driving circuit portion of the semiconductor device of the invention, disposed is a TFT having an LDD structure according to a self-aligned process based on using the side wall. On the other hand, in the high withstand voltage circuit portion (the active matrix portion) therein, disposed is a TFT having an LDD structure according to a non-self-aligned process based on using the mask.

The third aspect of the invention is a semiconductor device with a semiconductor circuit of semiconductor units, having a high withstand voltage circuit comprising a first semiconductor unit and a high-speed driving circuit comprising a second semiconductor unit, both on one and the same substrate, wherein;

the high withstand voltage circuit comprises a first gate electrode, an insulator to cover the upper surface and the side surface of the first gate electrode, and a first source region and a first drain region as doped with a dopant for N-type or P-type conductivity via the insulator serving as a mask, and the high-speed driving circuit comprises a second gate electrode, a side wall formed on the side surface of the second electrode, and a second source region and a second drain region as doped with a dopant for N-type or P-type conductivity via the side wall serving as a mask.

The fourth aspect of the invention is a semiconductor device comprising;

a multi-layered interconnection that comprises a layer of a material consisting essentially of tantalum and a layer of a metal material, the latter being layered on the former, an interlayer insulation film as formed to cover the multi-layered interconnection, and a metal interconnection as formed on the interlayer insulation film, wherein;

the interlayer insulation film has at least one opening, and
the multi-layered interconnection is interconnected with the metal interconnection via the opening.

The fifth aspect of the invention is a method for fabricating a semiconductor device having a semiconductor circuit comprising semiconductor units over a substrate having an insulation surface, which comprises;

a step of forming a crystalline semiconductor film over the substrate having the insulation surface, a step of forming a gate insulation film on the crystalline semiconductor film, a step of forming an interconnection on the gate insulation film, a first doping step to be effected with a dopant for N-type conductivity, via the interconnection serving as a doping mask, a step of forming a protective film to cover the interconnection, a step of forming an insulation film to cover the interconnection and the protective film, a step of forming a mask partly over the insulation film, a step of anisotropically etching the insulation film to form a nearly triangular insulator on the side surface of the interconnection with the insulator below the mask being left as such, a second doping step to be effected via the nearly triangular insulator, the remained insulator and the gate electrode all serving as doping masks, for which the dopant concentration is higher than that for the first doping step, and a heat treatment step for gettering an element used in the step of forming the crystalline semiconductor film, the element promoting crystallization of a semiconductor film.

The sixth aspect of the invention is a method for fabricating a semiconductor device having a semiconductor circuit comprising semiconductor units over a substrate having an insulation surface, which comprises;

a step of forming a crystalline semiconductor film over the substrate having the insulation surface, a step of forming a gate insulation film on the crystalline semiconductor film, a step of forming an interconnection on the gate insulation film, a step of forming an insulation film to cover the interconnection, a step of forming a mask partly over the insulation film, a step of anisotropically etching the insulation film to form a nearly triangular insulator on the side surface of the interconnection with the insulator below the mask being left as such, and a step of doping with a dopant for N-type conductivity or with a dopant for P-type conductivity via the nearly triangular insulator, the insulator below the mask and the gate electrode all serving as doping masks.

In the fifth and sixth aspects of the invention, preferably, the step of forming an interconnection on the gate insulation film comprises forming a first tantalum layer containing nitrogen, a second tantalum layer, and a third tantalum layer containing nitrogen in that order on the substrate in a continuous manner, followed by patterning the resulting multi-layered structure.

Also preferably, in the fifth and sixth aspects, the step of forming the crystalline semiconductor film comprises;

forming an amorphous semiconductor film to be in direct contact with the insulation surface of the substrate, contacting the amorphous semiconductor film with an element capable of promoting crystallization of the amorphous semiconductor film, and crystallizing the amorphous semiconductor film through heat treatment to convert it into the crystalline semiconductor film.

Also preferably, in the fifth and sixth aspects, the step of forming the crystalline semiconductor film comprises;

forming an amorphous semiconductor film to be in direct contact with the insulation surface of the substrate, contacting the amorphous semiconductor film with an element capable of promoting crystallization of the amorphous semiconductor film, and crystallizing the amorphous semiconductor film through laser irradiation to convert it into the crystalline semiconductor film.

BRIEF DESCRIPTION OF THE DRAWINGS

FIG. 1 is a cross-sectional view showing one embodiment of the semiconductor device structure of the invention (Example 1).

DETAILED DESCRIPTION OF THE INVENTION

Figure 2A:
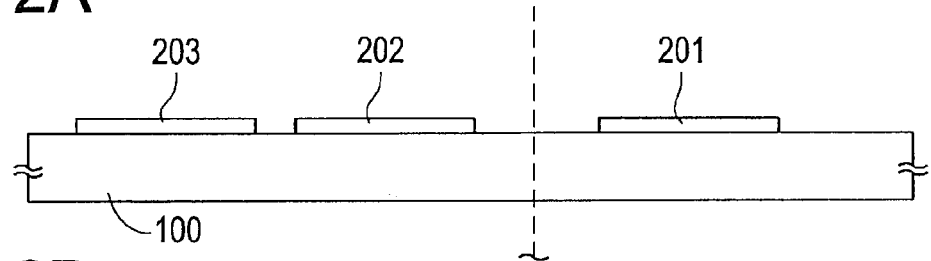
FIG. 2A to FIG. 2D are cross-sectional views showing one embodiment of the semiconductor device fabrication method of the invention (Example 1).

In the invention, the gate interconnections and the gate electrodes are of materials having good heat resistance, and are formed from those materials to have a multi-layered structure. Preferably, in the multi-layered structure, at least one layer is formed from tantalum (Ta) or from a material consisting essentially of tantalum. Tantalum is preferred as the material for interconnections, as its work function is near to that of silicon and therefore the threshold value of TFT having interconnections of tantalum shifts little.

Two types of crystal structures of Ta are known, $\alpha$-Ta having a body-centered cubic (bcc) lattice structure, and $\beta$-Ta having a tetragonal lattice structure. A thin film of $\beta$-Ta with a tetragonal lattice structure has a specific resistance of from 170 to 200 µΩcm or so; while that of α-Ta with a body-centered cubic lattice structure has a specific resistance of from 13 to 15 µΩcm or so. In general, most of Ta films are constituted of β-Ta. However, it is known that, when small amount of an impurity such as $N_2$ is added in forming Ta films, then the Ta films formed could be of α-Ta (this may be referred to as bcc-Ta).

In the invention, after a TaN film has been formed, a Ta film is directly formed thereon in a continuous manner, whereupon the Ta film is constituted of α-Ta. Though depending on composition of the TaN, the TaN film on which the Ta film is layered may have a thickness of at least 30 nm, but preferably at least 40 nm. On that, the Ta film formed may have a crystal structure morphology of α-Ta.

However, tantalum and a material consisting essentially of tantalum are readily oxidized and readily absorb hydrogen. Therefore, the problem with them is that the properties of Ta films change through oxidation or hydrogen absorption to increase the resistance thereof.

In order to evade the problem, in the invention, the gate interconnections and the gate electrodes are constructed to have a three-layered structure. Briefly, a TaN film is first formed, then a Ta film is layered on the TaN film and thereafter another TaN film is layered on the Ta film in a continuous film-forming manner. Finally, the three-layered film is covered with a protective film.

TaN films are hardly oxidized and hardly absorb hydrogen, as compared with Ta films. Therefore, in the invention, employed is a three-layered structure (TaN/Ta/TaN) in which a Ta film is sandwiched between a pair of TaN films. Having such a three-layered structure, the properties of the film are prevented from changing. In addition, in that structure, the uppermost layer is of a TaN film, which protects the underlying Ta film from being exposed outside in the step of forming contact holes through the layered film. In that condition, the multi-layered Ta film is prevented from being oxidized or from absorbing hydrogen.

Having the three-layered structure as formed in the continuous film-forming manner as above, the multi-layered film is further coated with a protective film prior to being subjected to heat treatment. With that structure, the multi-layered film is prevented from being oxidized or from absorbing hydrogen to increase its resistance.

Table 1 below shows the data of resistance change in a multi-layered tantalum film (TaN/Ta/TaN with a thickness of 50 nm/250 nm/50 nm) before and after heat treatment (at 450° C., 500° C., 550° C., 600° C.) for 2 hours. The Table 1 also shows the data of total thickness in the multi-layered tantalum film after the heat treatment. For the temperature history in the experiment, samples of the film were heated from 400° C. up to a temperature lower by 10° C. than a predetermined treatment temperature at a heating rate of 9.9° C./min, then further heated up to the treatment temperature at a heating rate of 5° C./min, kept at the treatment temperature for 2 hours, and then gradually cooled. After the temperature cycle, the resistance and the total thickness of each sample were measured.

TABLE 1

| Treatment Condition | Resistance before Treatment | Resistance after Treatment | Thickness after Treatment |
|---|---|---|---|
| 450° C., 2 hours | 17.5 kΩ | 25 kΩ | 400 nm |
| 500° C., 2 hours | 10.5 kΩ | 50 kΩ | 530 nm |

TABLE 1-continued

| Treatment Condition | Resistance before Treatment | Resistance after Treatment | Thickness after Treatment |
|---|---|---|---|
| 550° C., 2 hours | 19 kΩ | ∞ | 700 nm |
| 600° C., 2 hours | 10.5 kΩ | ∞ | 1000 nm |

From the Table 1, it is understood that the multi-layered tantalum film was changed (through oxidation, etc.) with the increase in the heat-treatment temperature thereby having an increased resistance and an increased thickness.

On the other hand, the multi-layered tantalum film (TaN/Ta/TaN) was coated with a protective film (SiN, having a thickness of 25 nm) and subjected to heat treatment (at 450° C., 500° C., 550° C., 600° C.) for 2 hours. Table 2 below shows the data of resistance change in the film before and after the heat treatment. The Table 2 also shows the data of total thickness in the multi-layered tantalum film after the heat treatment. The temperature history for the treatment was the same as in Table 1.

TABLE 2

| Treatment Condition | Resistance before Treatment | Resistance after Treatment | Thickness after Treatment |
|---|---|---|---|
| 450° C., 2 hours | 21.3 kΩ | 19.1 kΩ | 350 nm |
| 500° C., 2 hours | 19.8 kΩ | 19.0 kΩ | 350 nm |
| 550° C., 2 hours | 10.3 kΩ | 11.7 kΩ | 360 nm |
| 600° C., 2 hours | 50 kΩ | 40 kΩ | 340 nm |

From the Table 2, it is understood that the protective film (SiN) prevented the increase in the resistance and the thickness of the multi-layered tantalum film after heat treatment.

The experimental data verify that, when interconnection films of Ta having good heat resistance or of a material consisting essentially of Ta are covered with a protective film, then they may be well subjected to heat treatment at high temperatures (400 to 700° C.), for example, to treatment for gettering a metal element in crystalline semiconductor films. Gate interconnections of such a multi-layered and protected film (having a patterned line width of from 0.1 to 5 µm) are resistant to heat treatment at such high temperatures. In addition, as being protected with a protective film, they are not oxidized through such heat treatment and could still have low resistance.

In the TaN film, the ratio of nitrogen to the composition may fall between 5 and 60%. However, as depending on the sputtering device and the sputtering condition employed, the numerical range for the nitrogen ratio is not specifically defined. Plasma from Ar (argon) or Xe (xenon) is preferred for forming α-Ta films.

In place of tantalum, also employable are titanium, chromium, molybdenum, silicon, etc. In addition, their alloys such as Mo-Ta alloys, Nb-Ta alloys, W-Ta alloys and others are also employable. If desired, the alloys may contain nitrogen.

As the protective film for the invention, for example, employable are inorganic insulation films such as silicon nitride films, silicon oxinitride films and their multi-layered films. However, if the protective film contains oxygen or hydrogen, the underlying Ta film will be oxidized or will absorb hydrogen whereby its resistance will increase. Therefore, it is desirable that the amount of oxygen or hydrogen, if any, in the protective film is as small as possible. To exhibit its function, the protective film may have a thickness of from 10 to 100 nm. The step of forming the protective film is not specifically defined, provided that the protective film is formed prior to the step of heat treatment. For example, the protective film may be formed after the formation of gate electrodes, or after the formation of side walls, or after the doping step.

Figure 10:
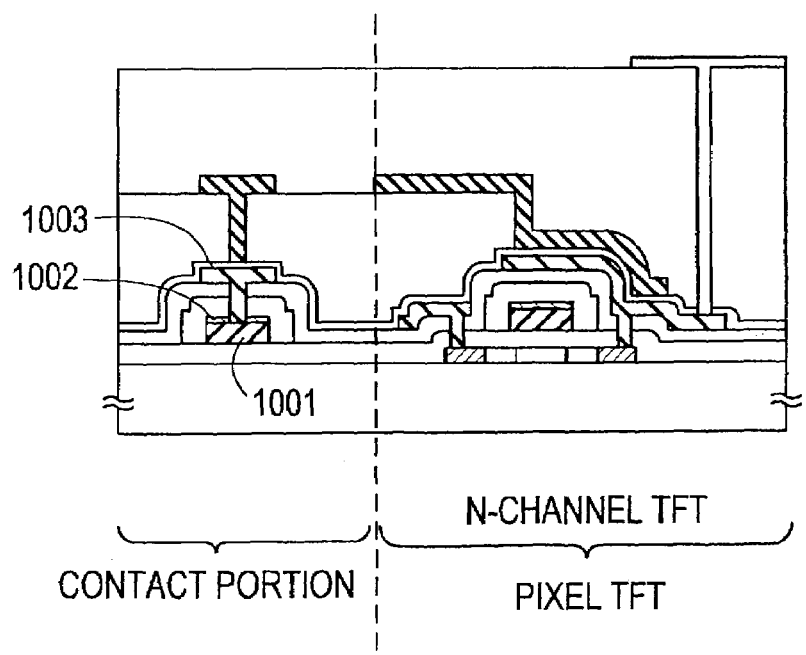
FIG. 10 is a cross-sectional view showing still another embodiment of the semiconductor device structure of the invention (Example 7).

Another preferred embodiment of the invention is shown in FIG. 10, which is for ensuring good ohmic contact between interconnections. As in FIG. 10, preferred is a multi-layered interconnection structure that comprises a layer 1001 consisting essentially of tantalum and an overlying layer 1002 consisting essentially of titanium. The overlying titanium-based layer prevents the tantalum-based layer 1001 from being oxidized or from absorbing hydrogen in the step of forming contact holes. In addition, since the titanium-based layer does not show an insulating property even when the titanium-based layer is exposed and is oxidized at the surface thereof, it ensures good ohmic contact. Specifically, in the illustrated embodiment, the titanium-based layer protects the underlying tantalum-based layer. The titanium-based layer facilitates the formation of contact holes (openings), because the margin in an etching process is secured.

The invention is characterized in that the LDD region is formed in a novel process, but not based on LDD region formation through conventional anodic oxidation (in a self-aligned process).

Figure 3A:
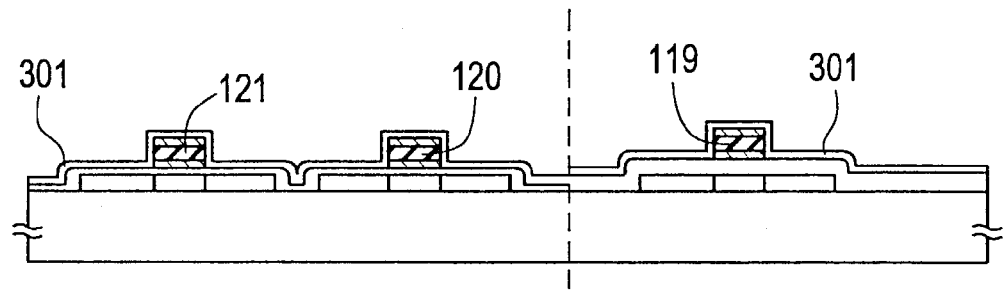
FIG. 3A to FIG. 3C are cross-sectional views showing one embodiment of the semiconductor device fabrication method of the invention (Example 1).
Figure 3B:
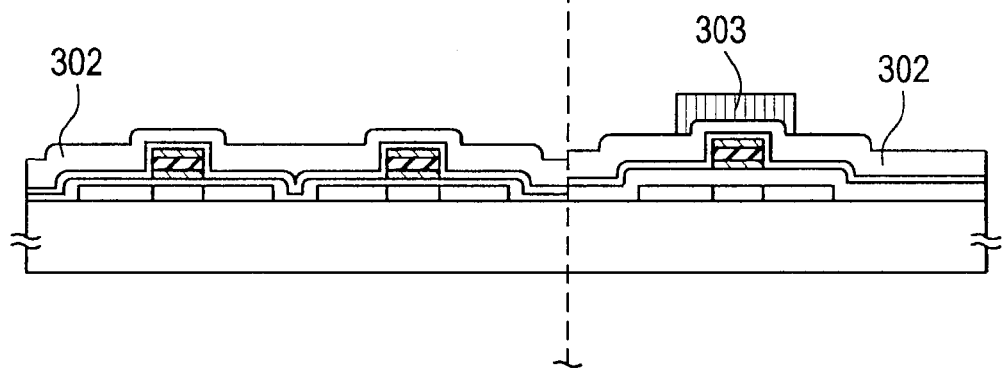
Figure 3C:
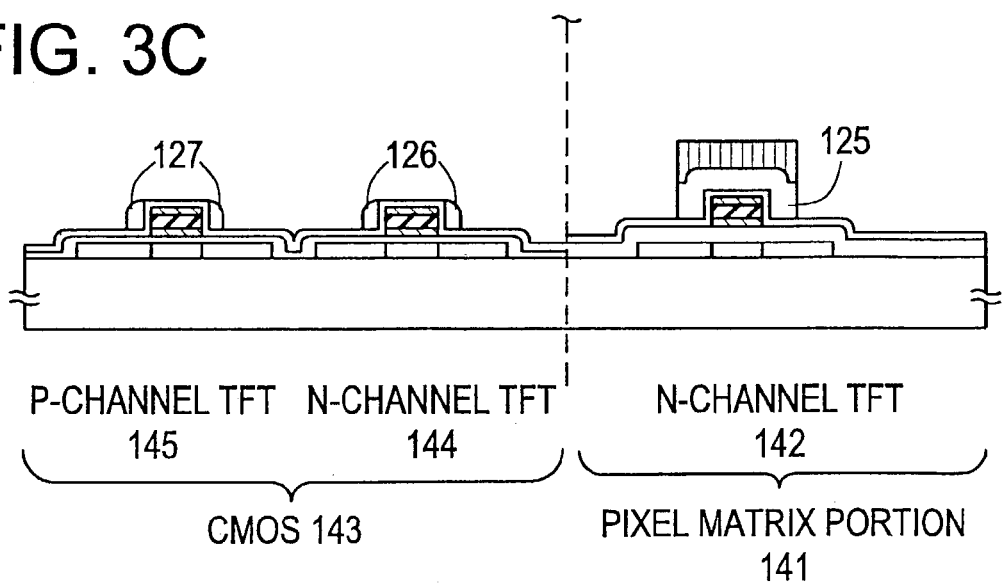
Figure 4A:
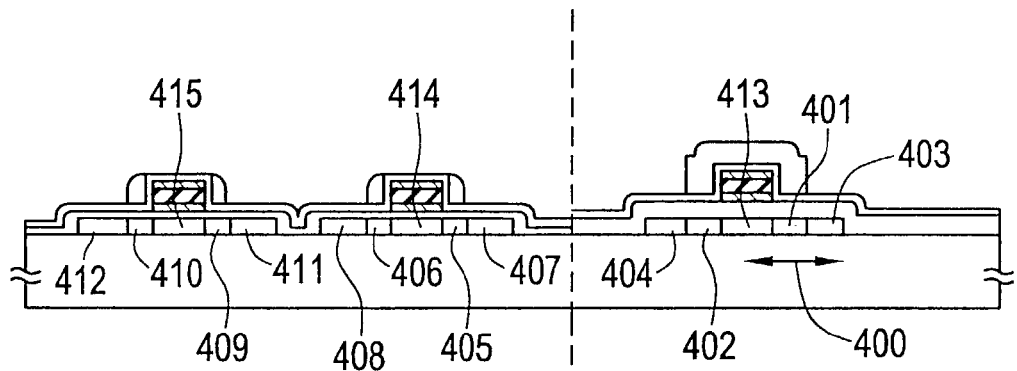
FIG. 4A to FIG. 4C are cross-sectional views showing one embodiment of the semiconductor device fabrication method of the invention (Example 1).

In the invention, N-channel TFTs are formed on one and the same substrate in a continuous process, as in FIG. 3C and FIG. 4A. Those N-channel TFTs have different structures separately for the pixel matrix (high withstand voltage circuit portion) and the logic circuit portion (high-speed driving circuit portion). For their formation, no additional step is needed.

Precisely, in the step of FIG. 3C, the insulation film 302 having been formed in the previous step of FIG. 3B is anisotropically etched. In this step, an insulator 125 is formed below the mask 303 (this is formed in the previous step) in the pixel matrix (high withstand voltage circuit portion), while, at the same time, the side walls 126 and 127 are formed in the high-speed driving circuit portion. In this step, the protective film 301 serves as an etching stopper, and protects the gate electrodes 119, 120 and 121.

In the embodiment comprising the steps of FIG. 3C and FIG. 4A, two kind of TFTs having different properties are fabricated by controlling the LDD width. Apart from this, the mask 303 may be suitably varied so as to vary the necessary width of the LDD region in any desired manner.

In the high withstand voltage circuit portion in the invention, the N-channel TFT disposed shall have low-concentration dopant regions 401 and 402 as in FIG. 4A, in which the dopant implanted is kept in a non-self-aligned process based on the mask 303 and the insulator 125 as in FIG. 3C.

The high withstand voltage circuit portion as referred to herein is meant to indicate a circuit predominantly requiring high-speed withstand voltage, for example, including a pixel matrix for applying voltage to liquid crystals, a buffer circuit for amplifying signals, etc.

The low-concentration dopant regions 401 and 402 to be in the high withstand voltage circuit such as a pixel matrix portion shall have a relatively large size of from 0.1 to 5 µm (but preferably from 0.3 to 2 µm) or so, for the purpose of lowering the OFF current. In order to ensure the operation symmetry in the case where the signal voltage being applied to the drain is reversed, it is desirable that the low-concentration dopant regions in the source and in the drain have the same size as far as possible. The size is herein defined in the direction of the carrier movement 400 as in FIG. 4A.

With the constitution noted above, TFT to be disposed in the pixel matrix could have a lowered OFF current characteristic.

On the other hand, in the high-speed driving circuit in the invention, the N-channel TFT disposed shall have low-concentration dopant regions 405, 406, 409 and 410, in which the dopant implanted is kept in a self-aligned process based on the side wall 126 as in FIG. 3C.

The high-speed driving circuit as referred to herein is meant to indicate a logic circuit for driving display devices, and this predominantly requires high-speed operation, including, for example, a CMOS circuit, etc.

The low-concentration dopant regions to be in the high-speed driving circuit shall be smaller in size than those in the high withstand voltage circuit, for ensuring high-speed operation of the driving circuit.

With the constitution noted above, TFT to be disposed in the high-speed driving circuit could have a high-speed driving characteristic.

According to the invention, for example, the N-channel TFTS to be in the pixel matrix and in the CMOS circuit could have different structures separately, as in FIG. 1. To fabricate the illustrated structure, any complicated process is not needed.

The invention is described in more detail with reference to the following Examples, which, needless-to-say, are not intended to restrict the scope of the invention.

EXAMPLE 1

One embodiment of the structure of the semiconductor device of the invention, which has a semiconductor circuit comprising semiconductor units, is described with reference to FIG. 1. The semiconductor device of the invention has a peripheral driving circuit and a pixel matrix portion both on one and the same substrate. To facilitate the illustration in this Example, FIG. 1 is drawn to have a CMOS circuit 143 as a part of a peripheral driving circuit and an N-channel TFT 142 as a part of a pixel matrix portion 141, both formed on one and the same substrate.

Figure 6A:
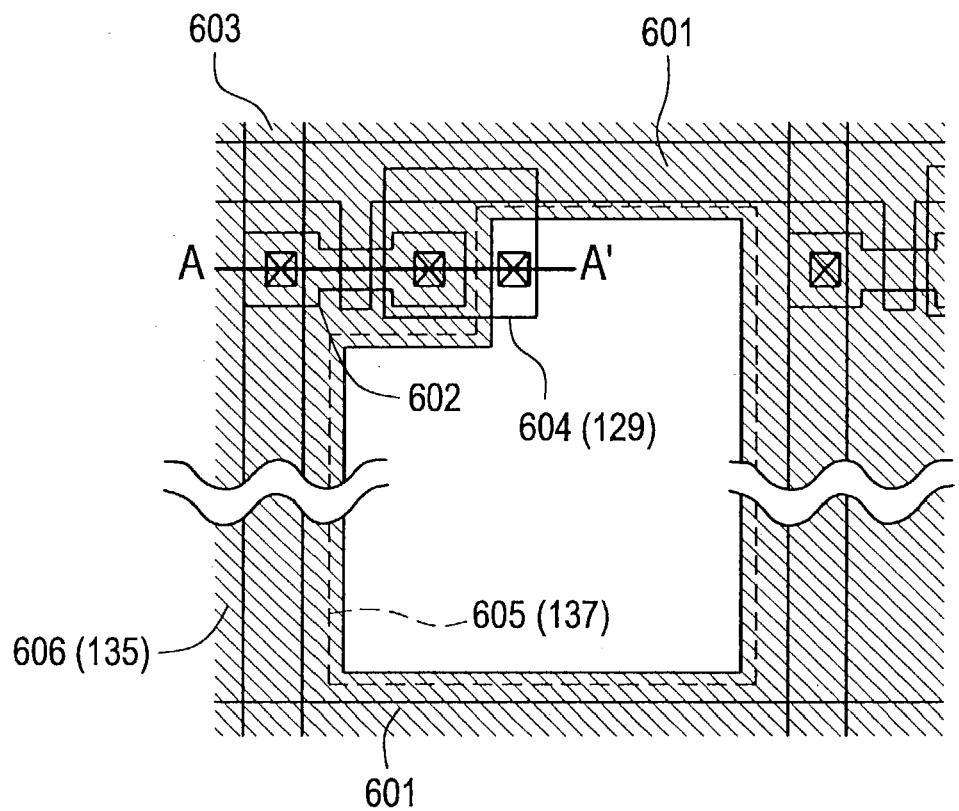
FIG. 6A and FIG. 6B are upper views showing the semiconductor device structure of the invention (Example 1).
Figure 6B:
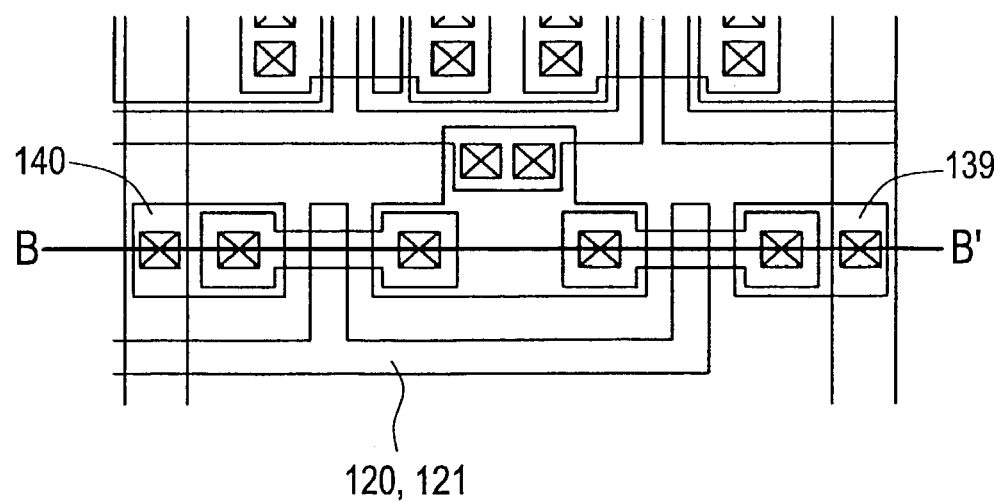

FIG. 6A is a top view of the pixel matrix portion of FIG. 1, and FIG. 6B is a top view of the CMOS circuit of FIG. 1. Precisely, the part as cut along the thick line A-A' in FIG. 6A corresponds to the cross-sectional view of the pixel matrix portion of FIG. 1; and that as cut along the thick line B-B' in FIG. 6B to the cross-sectional view of the CMOS circuit of FIG. 1.

In all thin film transistors (TFTs) on the substrate, the active layer of a crystalline semiconductor film is patterned in a predetermined manner.

In the P-channel TFT 145 in the CMOS circuit 143 serving as a high-speed driving circuit, the active layer is patterned into P$^+$ type high-concentration dopant regions 114 and 115 (source region and drain region), a channel forming region 111, and P-type low-concentration dopant regions 112 and 113 as formed between the P$^+$ type high-concentration dopant regions and the channel forming region. On the channel forming region, formed is a gate insulation film 118. Above the channel forming region, formed is a gate electrode 121, which is kept in contact with the gate insulation film and is covered with a protective film 124. An insulator (side wall) 127 having a nearly triangular cross section is provided around the side surface of the gate electrode via the protective film. To cover this, formed are a first interlayer insulation film 128, a passivation film 138, and a second interlayer insulation film 134. The high-concentration dopant regions 114 and 115 are connected with interconnections 132 and 133 and with leads 139 and 140. To cover the patterned structure, formed is a third interlayer insulation film 136.

On the other hand, the active layer in the N-channel TFT 144 in the CMOS circuit is patterned into N+ type high-concentration dopant regions 109 and 110 (source region and drain region), a channel forming region 106, and N-type low-concentration dopant regions 107 and 108 as formed between the N+ type high-concentration dopant regions and the channel forming region. In the N-channel TFT in the CMOS circuit, all the others than the active layer are the same as those in the P-channel TFT therein.

The structure of the N-channel TFT 142 to form the pixel matrix portion 141 that serves as a high withstand voltage circuit quite differs from that of the N-channel TFT 144 in the CMOS circuit 143. The differences are as follows: In the active layer in the former, N-channel TFT 142, the size of the low-concentration dopant regions is larger than that in the latter, N-channel TFT 144 in the CMOS circuit 143. In addition, the top surface and the side surface of the gate electrode 119 are all covered with an insulator 125 via a protective film 122. Last, the source region 105 is connected with an interconnection 130, while the drain region 104 is with an interconnection 129; a black mask 135 is provided on the passivation film 138 and on the second interlayer insulation film 134; and a pixel electrode 137 of ITO or the like is formed. In the pixel matrix portion, the direction in which carriers move are reversed. In the reversed case, the positions of the source region and the drain region in the pixel matrix portion shall be reversed.

In all thin film transistors (TFTS) illustrated, the low-concentration dopant regions as positioned in the side of the drain have the function of relaxing the electric field between the channel forming region and the drain region. Owing to that function, the carrier movement between the drain and the channel during OFF state is retarded whereby the OFF current is lowered, and in addition, these TFTs are protected from being degraded by hot carrier effects.

A method for fabricating the semiconductor device of FIG. 1 is described in detail hereinunder with reference to FIGS. 2A to 2D, FIGS. 3A to 3C, FIGS. 4A to 4C, and FIGS. 5A to 5C.

First prepared is a substrate having an insulation surface. The substrate may be any of glass substrates, quartz substrates, ceramic substrates and semiconductor substrates. In this Example, the substrate 100 is of quartz. To improve its surface flatness, the substrate may be coated with an underlying film (e.g., silicon oxide film, silicon nitride film, silicon oxinitride film, etc.).

Next, an active layer is formed on the substrate. The active layer may be of a crystalline semiconductor film (typically, crystalline silicon film) having a thickness of from 20 to 100 nm (preferably, from 25 to 70 nm). The crystalline silicon film may be formed in any known manner, for example, through laser crystallization, thermal crystallization or the like. In this Example, employed is a method of crystallizing an amorphous semiconductor film in which is used an element such as nickel capable of promoting the crystallization. The crystallization technique is described in detail in JP-A-7-130652 and JP-A-9-312260, which correspond to a U.S. Pat. No. 5,643,826 and a pending U.S. patent application Ser. No. 08/785,489 respectively. The entire disclosures of them are incorporated herein by reference. As the metal element capable of promoting crystallization, employable are any one or more selected from Fe, Co, Ni, Ru, Rh, Pd, Os, Ir, Pt, Cu and Au. Further employable are Ge and Pb that diffuse in amorphous semiconductor films in a manner of substitution diffusion. As other amorphous semiconductor films to be crystallized, also usable are Ge-containing silicon films.

In this Example, formed is an amorphous silicon film having a thickness of 50 nm through reduced pressure CVD. Next, a silicon oxide film having a thickness of 150 nm is formed on that film, for which is used TEOS. This is wet-etched to form an opening therethrough. Using a spinner, an Ni acetate solution is applied on this, and dried to form an Ni layer thereon. The Ni layer formed is not in the form of a complete layer. The Ni concentration in the Ni acetate solution to be used may fall between 1 and 20 ppm by weight. The Ni acetate solution used in this Example has an Ni concentration of 10 ppm. In this condition, Ni is kept in the opening. Next, the film is heated in a nitrogen atmosphere at 570° C. for 14 hours, whereby it is converted into a crystalline silicon film. During the heat treatment, silicon crystals grow from the region of the opening that keeps Ni therein, toward the direction nearly parallel to the surface of the substrate. The crystal growth morphology is referred to as lateral growth. The crystalline silicon film thus formed is a polysilicon film having good crystallinity, in which the crystal lattices run continuously in the crystal boundaries.

After this, the crystalline silicon film may be subjected to a gettering step of heating it in a nitrogen, oxygen or halogen atmosphere at 400 to 1000° C. for 0.1 to 12 hours to form an oxide film thereon, followed by removing the oxide film. Through the step, the element such as nickel used in crystallizing is removed from the crystalline silicon film, and the quality of the film is improved.

Next, the crystalline silicon film thus formed in the manner as above is patterned through ordinary photolithography to give the active layer 202 for the N-channel TFT 144, the active layer 203 for the P-channel TFT 145, and the active layer 201 for the N-channel TFT 142 to be in the pixel matrix (FIG. 2A). In FIG. 2A, each one active layer is formed for each TFT, and three active layers are shown in total. In practical devices, however, plural N-channel TFTs and plural P-channel TFTs are formed, depending on the circuit structure comprising them.

Figure 2B:
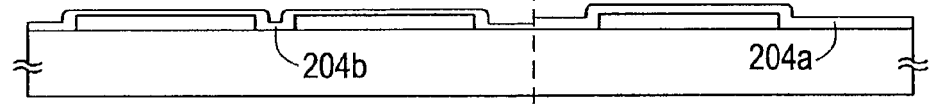

Next formed are insulation films 204a and 204b to cover the active layers 201 to 203. These films are to be formed into gate insulation films 116 to 118 in subsequent steps. In this Example, the insulation films 204a and 204b formed are of silicon oxinitride ($Si_xN_y$), having a thickness of 100 nm and 50 nm, respectively (FIG. 2B). The film to be a gate insulation film in the high withstand voltage circuit is made selectively thicker than that to be a gate insulation film in the high-speed driving circuit so as to ensure higher pressure resistance of the high withstand voltage circuit. Forming insulation films having different thicknesses may be attained in any known manner. For example, an insulation film having a thickness of 50 nm is formed on the entire surface of the substrate, and an additional insulation film having a thickness of 50 nm is selectively layered on a part of it. Those insulation films 204a and 204b may be any of a silicon oxide film, a silicon nitride film, a silicon oxinitride film or a multi-layered film of any of them, and their thickness may fall between 10 and 300 nm. After having been formed, the insulation films may be optionally subjected to a gettering step of heating them, for example, in a nitrogen, oxygen or halogen atmosphere at 400 to 1000° C. for 0.1 to 12 hours to form an oxide film thereon. Through the gettering step of such heat treatment, the element such as nickel could be removed, and the oxide film formed could be a part of the insulation films.

Next formed are a tantalum nitride film (TaN, having a thickness of from 30 to 100 nm), a tantalum film (Ta, having a thickness of from 100 to 400 nm) and a tantalum nitride film (TaN, having a thickness of from 30 to 100 nm) in that order on the insulation films in a continuous sputtering process, in which the concentration of the nitrogen gas to be introduced into the sputtering chamber is controlled. These films formed are then patterned into three-layered gate interconnections and gate electrodes.

In this Example, the Ta film shall have a three-layered structure so as to comprise low-resistance α-Ta, for which a TaN film (preferably having a thickness of at least 40 nm) is first formed and Ta is layered thereon in a continuous film-forming manner.

Figure 2C:
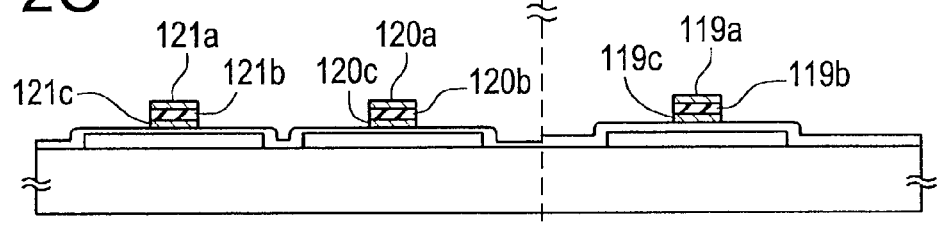

As compared with a film of TaN, a film of Ta more readily absorbs hydrogen and is more readily oxidized. Therefore, in this Example, the three-layered Ta film is so constructed that Ta is sandwiched between two layers of TaN (TaN 119c, 120c, 121c, having a thickness of 50 nm, Ta 119b, 120b, 121b, having a thickness of 250 nm and TaN 119a, 120a, 121a, having a thickness of 50 nm), thereby preventing the resistance increase therein (FIG. 2C). In this, the outermost layer is of TaN, which is for preventing the Ta layer from being exposed outside to be oxidized or to absorb hydrogen while contact holes for interconnection are formed through the Ta film. With that three-layered structure, the Ta film ensures good ohmic contact.

Any other interconnection materials except tantalum are also employable, including, for example, Mo, Ti, Nb, W, Mo-Ta alloys, Nb-Ta alloys, W-Ta alloys, etc. Further employable are nitrogen compounds of those materials, as well as silicon compounds thereof such as silicide.

Figure 2D:
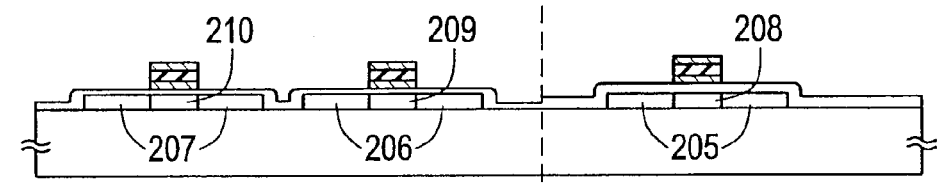

Next, the P-channel TFT is selectively covered with a resist (not shown), and the part of the active layer not covered therewith is doped with phosphorus through ion implanting via the gate electrodes serving as masks, in a self-aligned manner. The dose is from $1\times10^{13}$ to $8\times10^{15}$ atoms/cm$^3$. The resist is removed. Next, in the same manner, the N-channel TFTs are selectively covered with a resist, (not shown), and the part of the active layer not covered therewith is doped with boron through ion implanting. In this step, formed are low-concentration dopant regions of weak N-type regions (N− regions) 205 and 206 and a weak P-type region (P− region) 207 (FIG. 2D). In this Example, the doping is effected through ion implantation. Apart from this, also employable are any other doping methods, for example, a plasma doping method, a method of applying a solution that contains dopant ions through coating, a method of forming a film that contains dopant ions.

Next formed is a protective film 301 of an inorganic substance to cover the gate electrodes 119, 120 and 121. In this Example, the tantalum film to form the gate electrodes is readily oxidized and readily absorbs hydrogen, whereby the resistance of the gate electrodes will increase. To overcome this problem, the gate electrodes are covered with the protective film 301 of, for example, silicon nitride. As other materials for the protective film, also employable are a silicon nitride film, a silicon oxinitride film (SiO$_x$N$_y$), an amorphous silicon film, a crystalline silicon film, and also multi-layered films comprising any of them. The protective film protects the gate electrodes and their interconnections from laser rays and heat. In addition, it further protects them from anisotropic etching environment (fluorine-containing etching gas, plasma shock, etc.). Further, the protective film serves as an etching stopper in the anisotropic etching step to follow later. The protective film may have a thickness of from 10 to 100 nm. In this Example, it has a thickness of 25 nm (FIG. 3A).

The protective film may be formed immediately after the interconnection patterning. The order of the processing steps may be suitably determined by operators.

Next formed is an insulation film having a thickness of from 200 to 1000 nm. In this Example, a silicon oxide film 302 is formed to have a thickness of 300 nm. As other materials for the insulation film, also employable are a silicon nitride film, a silicon oxinitride film (SiO$_x$N$_y$), an amorphous silicon film, a crystalline silicon film, and also multi-layered films comprising any of them. It is important that the insulation film surely covers the side surface of all gate electrodes. Next, a resist 303 is formed, which is for forming an LDD region on the N-channel TFT that constitutes the pixel matrix (FIG. 3B).

Next, the insulation film is anisotropically etched in dry. After this step, obtained is the condition of FIG. 3C. In this step, the protective film serves as an etching stopper.

Specifically, as in FIG. 3C;

1) formed are side walls 126 and 127 around the gate electrodes in the N-channel TFT and the P-channel TFT to be in the CMOS circuit (through the anisotropic etching), and 2) formed is an insulator 125 on the N-channel TFT to be in the pixel matrix (for which the mask 303 serves as an etching mask).

The above two are effected at the same time in one dry-etching step, without complicating the process of forming the N-channel TFTs that differ in the width of the LDD region, in the subsequent doping step.

The resist 303 is removed and a second phosphorus doping step comes next, at a low accelerated voltage of from 5 to 10 keV (FIG. 4A). In this Example, the doping is effected through ion implantation so as to prevent any impurity, especially hydrogen from being added to the gate electrodes. As the case may be, any other doping methods may also be employed, for example, a plasma doping method, a method of applying a phosphorus ion-containing solution through coating, or a method of forming a phosphorus ion-containing film.

In this step, formed are high-concentration dopant regions (N$^+$ regions) 403, 404, 407 and 408 having a high phosphorus concentration, and regions 411 and 412 having a low boron concentration but having a high phosphorus concentration. In this Example, the N$^+$ regions are controlled to have a phosphorus concentration of from $1\times10^{20}$ to $8\times10^{21}$ atoms/cm$^3$. On the other hand, the N− regions 401, 402, 405 and 406 are controlled to have a phosphorus concentration of from $1\times10^{15}$ to $1\times10^{17}$ atoms/cm$^3$. In the N-channel TFTs, the N$^+$ regions are to be the source region and the drain region, while the N− regions are low-concentration dopant regions.

Figure 4B:
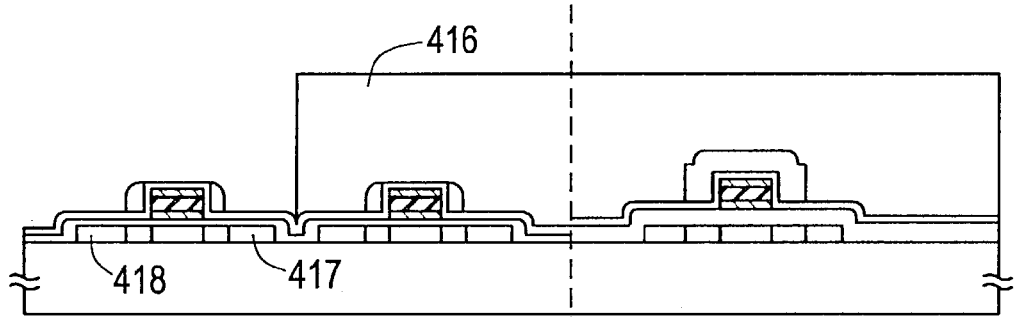

Next, the N-channel TFTs are covered with a resist 416, and boron is implanted in the active layer for the P-channel TFT to form P$^+$ regions 417 and 418 (FIG. 4B). The boron dose is so controlled that the boron concentration in the P$^+$ regions could be from about 1.3 to about 2 times that in the N$^+$ regions. In this Example, the boron doping is effected through ion implantation so as to prevent any impurity, especially hydrogen from being added to the gate electrodes. As the case may be, any other doping methods may also be employed, for example, a plasma doping method, a method of applying a boron ion-containing solution through coating, or a method of forming a boron ion-containing film.

The P+ regions 417 and 418 are to be the source region and the drain region in the P-channel TFT, while the P-regions 409 and 410 are low-concentration dopant regions therein. The other regions 413, 414 and 415 doped with neither phosphorus nor boron are intrinsic or substantially intrinsic channel forming regions that shall be carrier moving paths later.

The wording "intrinsic" as referred to herein is meant to indicate the region containing no impurity that may change the Fermi level of silicon; while the wording "substantially intrinsic" is meant to indicate the region where electrons and holes are completely balanced with each other to cancel its conductivity, or that is, the region that contains an N-type or P-type dopant within a dopant concentration range ($1 \times 10^{15}$ to $1 \times 10^{17}$ atoms/cm$^3$) within which the threshold voltage control is possible, or the region as intentionally doped with a dopant having a counter-conductivity so as to cancel its conductivity.

After this, a silicide may be formed to lower the resistance of the gate electrodes. In the optional step, for example, the protective films and the gate insulation films are selectively removed, and a metal film may be formed selectively on the N+ regions or on the P+ regions. As the metal element for silicification, employable is any of cobalt, titanium, tantalum, tungsten, molybdenum, etc.

Next, the substrate is heated in an inert or oxidizing atmosphere at a temperature not lower than 450° C. for 0.1 to 12 hours. In this Example, the substrate is heated at 550° C. for 1 to 2 hours. Regarding its uppermost limit, the heating temperature must not be higher than the deformation point of the substrate used (FIG. 4C).

Figure 4C:
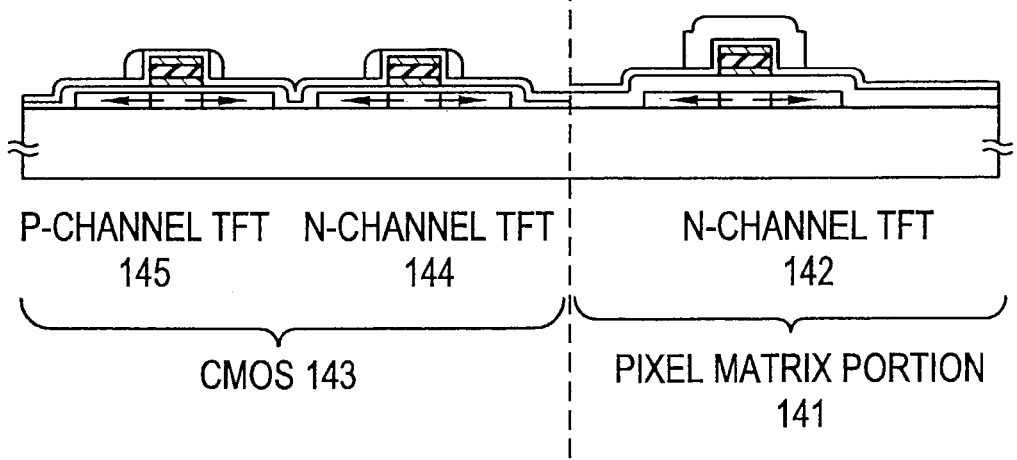

In the heating step, Ni having been intentionally added to the amorphous silicon film for crystallizing the film diffuses from the channel forming regions to the source regions and the drain regions, as schematically indicated by the arrows in FIG. 4C. This is because those regions have a high phosphorus concentration, and the element (Ni) having reached the source regions and the drain regions are gettered in those regions. Through heat treatment at 400 to 600° C. for 0.5 to 4 hours, Ni is well gettered.

As a result, the Ni concentration in the channel forming regions could be lowered. Concretely, the Ni concentration in the channel forming regions could be lowered to the critical limit for SIMS of at most $5 \times 10^{17}$ atoms/cm$^3$. On the other hand, the Ni concentration in the gettering sinks, source regions and drain regions, shall be higher than that in the channel forming regions.

As the dopant for N-type conductivity, also employable are antimony and bismuth, in addition to phosphorus. Phosphorus has the highest gettering ability, and antimony is the next.

In particular, it has been confirmed through experiments that the gettering ability of the source and drain regions 114 and 115 in the P-channel TFT, as doped with both phosphorus and boron in such a manner that the boron concentration therein is from about 1.3 to about 2 times the phosphorus concentration therein, is higher than that of the source and drain regions in the N-channel TFT doped with phosphorus only.

Through the heat treatment, the element such as nickel is gettered, and, in addition, phosphorus and boron having been doped in the source regions, the drain regions and the low-concentration dopant regions are activated. In the prior art technique using aluminum, heat treatment at 450° C. or so could be applied to the substrate, since the heat resistance of aluminum is poor. In this Example, however, the heat treatment may be effected at a temperature of 500° C. or higher, whereby the dopant could be fully activated. In this, in addition, the resistance of the source regions and the drain regions could be well lowered through the heat treatment only.

Moreover, the heat treatment restores the crystallinity in the regions where the crystallinity is damaged in the ion doping steps.

Specifically, the heat treatment in an inert or oxidizing atmosphere attains the following all at a time:

1) gettering the element such as nickel to lower the element concentration in the channel forming regions, 2) dopant activation in the source regions and the drain regions, and 3) annealing to restore the crystal structure having been damaged in the ion doping steps.

Simultaneously with or before or after the heat treatment, the substrate may be subjected to photoannealing with laser rays or with IR or UV rays.

Figure 5A:
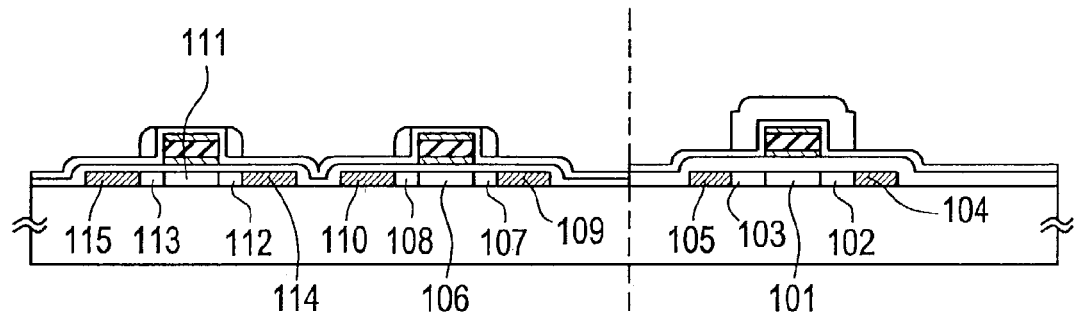
FIG. 5A to FIG. 5C are cross-sectional views showing one embodiment of the semiconductor device fabrication method of the invention (Example 1).

After the condition of FIG. 5A has been obtained, a first interlayer insulation film 128 is formed. The first interlayer insulation film 128 may be any of a silicon oxide film, a silicon nitride film, a silicon oxinitride film ($SiO_xN_y$), or an organic resin film. For the organic resin film, usable are polyimides, acrylic resins, and BCB (benzocyclobutene). As the first interlayer insulation film 128, herein formed is a silicon nitride film having a thickness of 300 nm through plasma CVD.

Next formed are contact holes. A metal film to be silicified is selectively formed around the contact holes, and silicified under heat, and then the metal film is removed. The metal element to be silicified includes, for example, cobalt, titanium, tantalum, tungsten, molybdenum, etc. The silicification ensures good ohmic contact. Next, a metal film (not shown) is formed around the contact holes, from which are formed contact electrodes. As the metal film, herein formed is a three-layered film of titanium/aluminum/titanium through sputtering. The three-layered metal film is patterned into electrodes and interconnections, 129, 130, 131, 132 and 133.

Figure 5B:
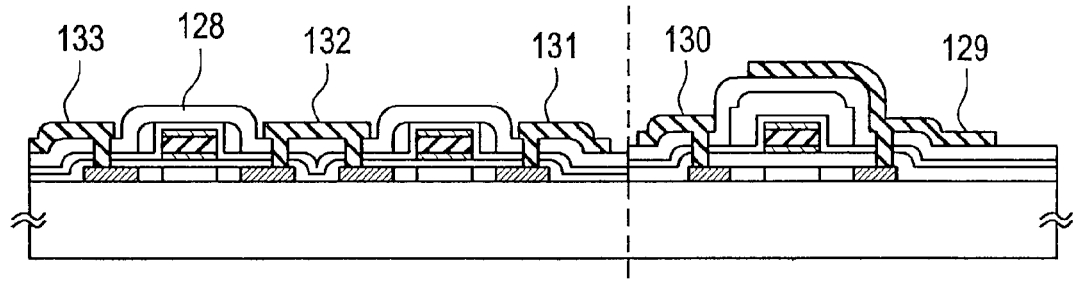
Figure 5C:
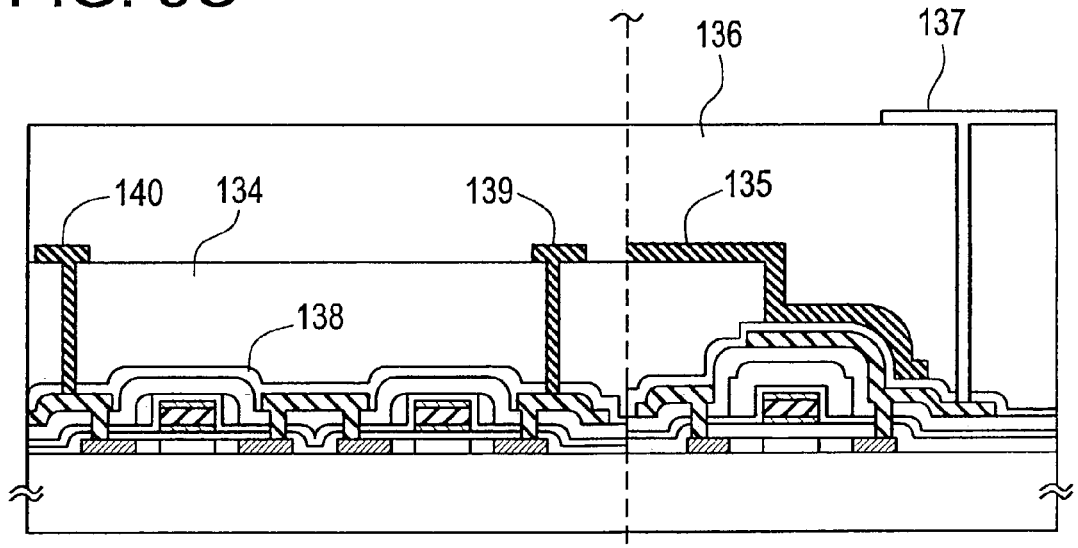

Thus is obtained the condition of FIG. 5B. Next, a passivation film 138 is formed. The passivation film 138 may be a silicon oxide film, a silicon nitride film, or a silicon oxinitride film. Herein formed is a silicon nitride film having a thickness of 200 nm through plasma CVD.

Next formed is a second interlayer insulation film 134 of, for example, an acrylic resin. The second interlayer insulation film 134 may be any of a silicon oxide film, a silicon nitride film, a silicon oxinitride film, or an organic resin film. Herein formed is an organic resin film having a thickness of 1 μm through spin coating. As other organic films, employable are polyimides, polyimidamides, polyamides, BCB (benzocyclobutene), etc.

Next, the second interlayer insulation film 134 is etched to form contact holes, around which is formed a metal film of Ti having a thickness of 300 nm. The metal film is patterned to form a black mask 135 and leads 139 and 140.

In this Example, the black mask 135 and the electrode 129 produce auxiliary capacitance.

Next formed is a third interlayer insulation film 136 of, for example, an acrylic resin. The third interlayer insulation film 136 may be any of a silicon oxide film, a silicon nitride film, a silicon oxinitride film, or an organic resin film. In this Example, the third interlayer insulation film 136 is formed through spin coating, and this has a thickness of 1 μm. As other organic substances for the film 136, employable are polyimides, polyimidamides, polyamides, BCB (benzocyclobutene), etc. The film 136 of an organic substance could be planarized with ease, as illustrated.

Next, a contact hole is formed through the film 136, in which is formed a pixel electrode 137. In this Example, an ITO (indium tin oxide) film is formed through sputtering to have a thickness of 100 nm, and this is then patterned to form the pixel electrode 137.

Finally, the substrate is heated in a hydrogen atmosphere at 350° C. for 1 hour to reduce the defects in the semiconductor layers formed thereon. Thus is obtained the condition of FIG. 5C.

In the process as above, one of a pair of substrates to constitute a liquid-crystal panel is completed. This substrate is referred to as a TFT substrate. Apart from this, an orientation film (not shown) for orienting liquid crystal materials, and a sealant are prepared and attached to a counter substrate which is also separately prepared. The TFT substrate is paired with the counter substrate, and liquid crystal materials are filled thereinto to complete a liquid crystal panel.

According to the process of this Example, the following circuits:

a semiconductor circuit comprising an N-channel TFT and having the advantage of low OFF current and high reliability, and a semiconductor circuit comprising an N-channel TFT and a P-channel TFT and having the advantage of high-speed operation, are integrated on one and the same substrate.

For simplifying the structure illustrated, the TFT in the pixel matrix portion in this Example is designed to have a single-structured gate electrode. In order to further reduce the OFF current fluctuation in the pixel matrix portion, it is desirable that the TFT therein has a multi-structured gate electrode of at least a double-structured gate electrode, more preferably a triple-structured gate electrode.

The TFT structure employed in this Example is one type of top-gate structures (co-planar structures), which, however, is not limitative. The invention is applicable also to bottom-gate TFTs. This Example is to fabricate a transmission-type LCD, which is one embodiment of semiconductor devices and is not limitative. In place of ITO, any other metal films having high reflectivity may be used to form pixel electrodes to be in reflection-type LCDs, for which the mode of patterning metal films may be changed with ease. In fabricating reflection-type LCDs, employable is a multi-layered underlying film which is composed of a heat-resistant metal film and an overlying insulation film, or is composed of an aluminum nitride film and an overlying insulation film. The multi-layered underlying film is preferred, as the underlying metal film serves as a heat-radiating film. The order of the processing steps as above may be altered in any desired manner by operators.

Figure 7:
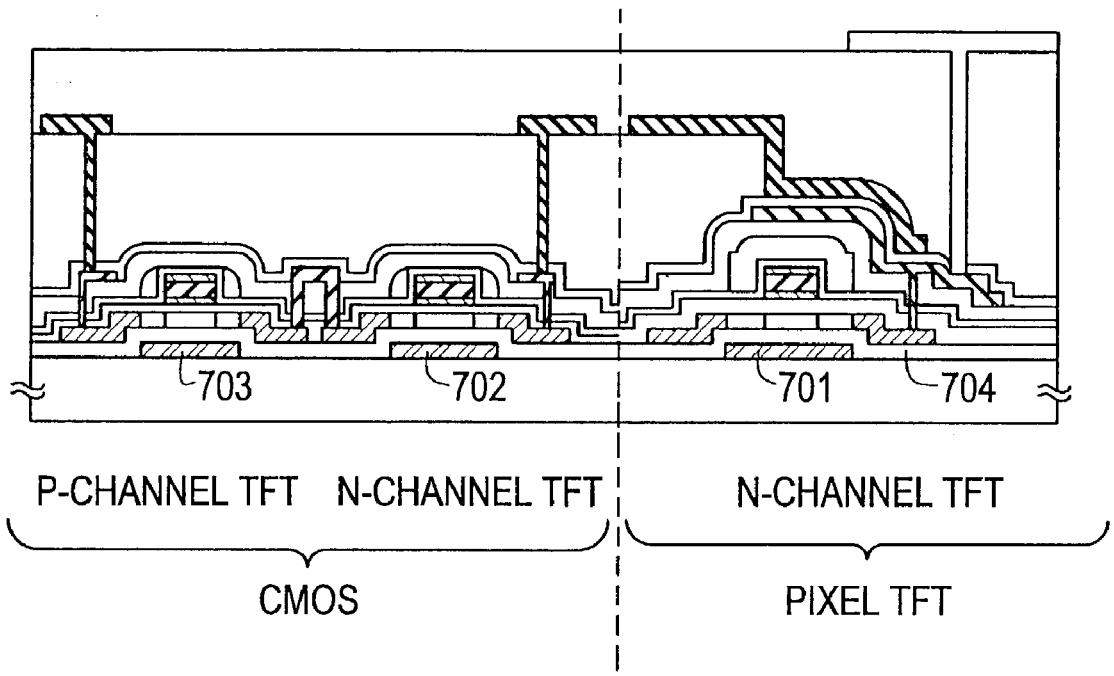
FIG. 7 is a cross-sectional view showing another embodiment of the semiconductor device structure of the invention (Example 2).

EXAMPLE 2

Where the semiconductor device as fabricated in Example 1 could not have a desired threshold voltage, it must be modified so as to control its threshold voltage. In this Example 2, electrodes 701, 702 and 703 are provided, as in FIG. 7, to which is applied some voltage so as to control the threshold voltage of the device illustrated. The basic structure of the device of Example 2 is almost the same as that of the device of Example 1, and the difference between the two devices is described herein.

In this Example, an amorphous or crystalline semiconductor (silicon) film is formed on a substrate, then patterned, and doped with phosphorus to form silicon electrodes 701, 702 and 703. The dopant, phosphorus determines the type of conductivity of the electrodes doped with it.

Where the threshold voltage of the P-channel TFT and the N-channel TFTs is desired to be shifted to a minus side, providing silicon electrodes doped with an element of Group 13, such as boron in those TFTs is effective. On the other hand, where the threshold voltage of the TFTs is desired to be shifted to a plus side, silicon electrodes doped with an element of Group 15 such as phosphorus may be provided in the TFTs.

As the electrodes 701, 702 and 703, employable are films of high-melting-point, conductive materials consisting essentially of an element of Ta, Ti, Si or the like, or multi-layered films comprising a plurality of those materials.

Next, the surface of the substrate is entirely covered with an insulation film 704. The substrate is then processed in the same manner as in Example 1 to form TFTs thereon, as in FIG. 7. Where the threshold voltage of the P-channel TFT and the N-channel TFTs is desired to be shifted to a minus side, doping the insulation film 704 with an element of Group 13, such as boron in those TFTs is effective. On the other hand, where the threshold voltage of the TFTs is desired to be shifted to a plus side, the insulation film 704 is preferably doped with an element of Group 15 such as phosphorus.

In the device of this Example, when the electrodes 701 and 702 are charged to have a positive voltage, then the threshold voltage of the N-channel TFTS will be shifted to a minus side. When, on the other hand, the electrodes 701 and 702 are charged to have a negative voltage, then the threshold voltage of the N-channel TFTS will be shifted to a plus side. Similarly, the threshold voltage of the P-channel TFT could be controlled in any desired manner.

In the transmission-type liquid-crystal display device as in this Example, the electrodes 701, 702 and 703 have an additional function of protecting TFTs from being degraded by the incident light having entered the device through the back surface of the substrate.

EXAMPLE 3

Figure 8:
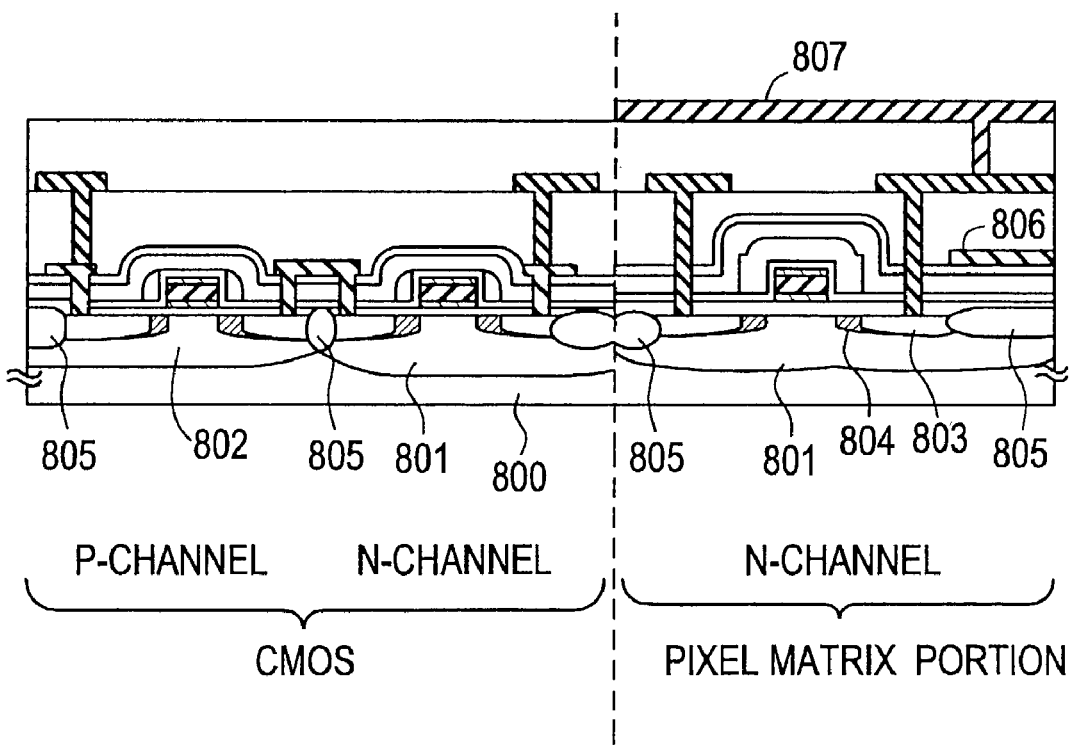
FIG. 8 is a cross-sectional view showing still another embodiment of the semiconductor device structure of the invention (Example 3).

The structure of the invention is applicable to Si chip-based liquid-crystalline devices having semiconductor units for a pixel matrix and a peripheral driving circuit formed on a single-crystal silicon substrate. FIG. 8 shows one embodiment of the invention as applied to a reflection-type liquid-crystalline device. The basic structure of the device illustrated herein is almost the same as that of the device in Example 1, and the difference between the two devices is described herein.

In FIG. 8, 801 is a P-type semiconductor region, 802 is an N-type semiconductor region, 803 is a drain region, 804 is a low-concentration impurity region, 805 is a field oxide film as formed in a LOCOS (Local Oxidation of Silicon) process, 806 is a capacitance electrode, and 807 is a reflection electrode of a metal. The source region and the drain region are doped with phosphorus to have N-type conductivity. Where the two regions are desired to have a P-type conductivity, they may be doped with boron.

EXAMPLE 4

In this Example, the method of forming the crystalline semiconductor film differs from that in Example 1. In this Example, an element capable of promoting silicon crystallization is added to an amorphous silicon film, and rectangular or square laser beams are applied to the film so as to crystallize it. According to this method of specific laser crystallization, a region having a size of from a few $cm^2$ to hundreds $cm^2$ of an amorphous silicon film is uniformly processed with the laser beams all at a time, whereby the region is made crystalline. The basic structure of the device to be fabricated herein is almost the same as that of the device in Example 1, and the difference between the two devices is described herein.

In this Example, a solution containing an element (Ni) is applied onto the surface of an amorphous silicon film through coating, whereby the film shall have the element concretely, an Ni acetate solution is used. The Ni concentration in the solution may fall between 1 and 1000 ppm by weight. In this Example, the Ni acetate solution used has an Ni concentration of 100 ppm. In that condition, the surface of the amorphous silicon film has Ni therein. The film is then exposed to excimer laser beams (wavelength: 248 to 308 nm) in an inert or oxidizing atmosphere, whereby it is converted into a crystalline silicon film. The laser exposure may be combined with heat treatment. In place of laser beams, any other strong light may be applied to the film, for example, RTA or RTP.

Concretely, in this Example, rectangular or square laser beams having a wavelength of 248 nm are applied to an amorphous silicon film, for which is used a laser apparatus (SAELC manufactured by SOPRA Inc.). Through the laser exposure, a region of the film having a size of from a few $cm^2$ to hundreds $cm^2$ is uniformly processed with the laser beams all at a time, whereby the region is made crystalline.

The subsequent steps are the same as those in Example 1, and are not described herein. In this Example, formed are good TFTs.

The technique of this Example may be combined with that of Example 2 or Example 3.

EXAMPLE 5

In this Example, the method of forming the crystalline semiconductor film differs from that in Example 1. In this Example, a catalyst element is not used for crystallization, and an amorphous semiconductor film is crystallized through heat treatment or laser exposure. Specifically, rectangular or square laser beams are applied to an amorphous semiconductor film so as to crystallize it. According to the method of specific laser crystallization, a region having a size of from a few $cm^2$ to hundreds $cm^2$ of an amorphous semiconductor film is uniformly processed with the laser beams all at a time, whereby the region is made crystalline. The basic structure of the device to be fabricated herein is almost the same as that of the device in Example 1, and the difference between the two devices is described herein.

In this Example, an amorphous silicon film is formed and then exposed to excimer laser beams (wavelength: 248 to 308 nm) in an inert or oxidizing atmosphere, whereby it is converted into a crystalline silicon film. The laser exposure may be combined with heat treatment. In place of laser beams, any other strong light may be applied to the film, for example, RTA or RTP.

Concretely, in this Example, rectangular or square laser beams having a wavelength of 248 nm are applied to an amorphous silicon film, for which is used a laser apparatus (SAELC manufactured by SOPRA Inc.). Through the laser exposure, a region of the film having a size of from a few $cm^2$ to hundreds $cm^2$ is uniformly processed with the laser beams all at a time, whereby the region is made crystalline.

The subsequent steps are the same as those in Example 1, and are not described herein. Being different from Example 1 and Example 2, no element such as nickel is used in this Example. Therefore, the crystalline silicon film formed in this Example contains few impurities, and TFTs having better properties are formed.

EXAMPLE 6

Figure 9:
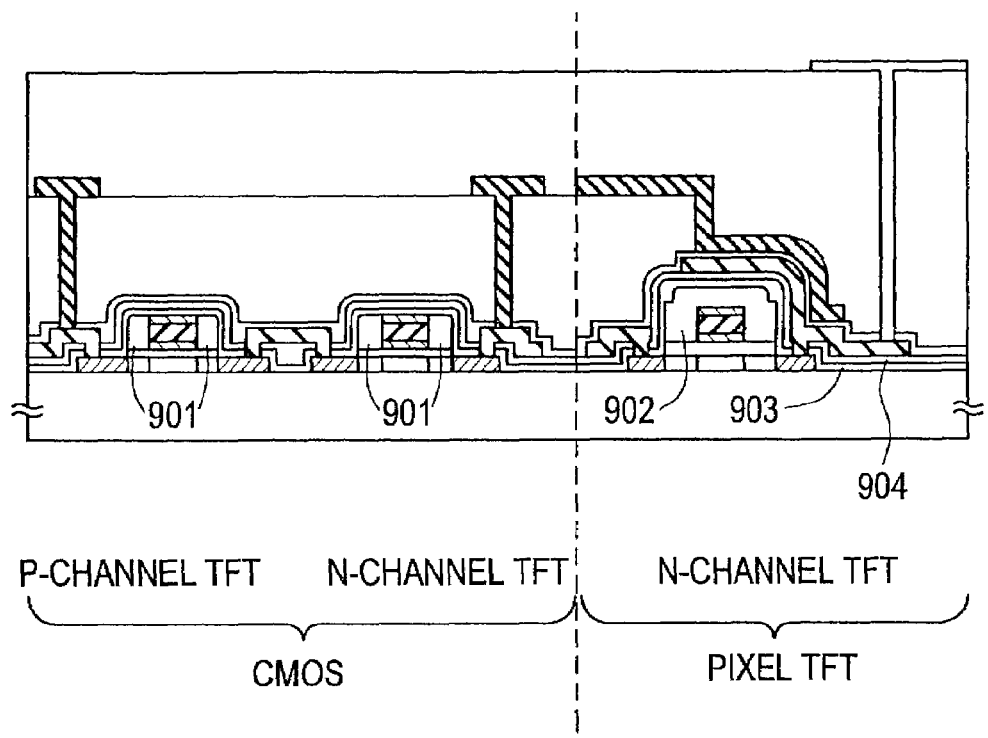
FIG. 9 is a cross-sectional view showing still another embodiment of the semiconductor device structure of the invention (Example 6).

This Example differs from Example 1 in the order of the steps for protective film formation. In this Example, after side walls have been formed, a protective film is formed to cover them. The basic structure of the device to be fabricated herein is almost the same as that of the device in Example 1, and the difference between the two devices is described herein with reference to FIG. 9.

In this Example, a side wall 901 is formed through anisotropic etching, around the gate electrodes to be in a high-speed driving circuit, while an insulator 902 is formed on the top surface and the side surface of the gate electrode to be in a high withstand voltage circuit. Next, the substrate is processed in the same manner as in Example 1 for forming a gate insulation film, doping with phosphorus and doping with boron, and thereafter a protective film 903 and an interlayer insulation film 904 are formed.

Next, the substrate is heated in an inert or oxidizing atmosphere at 450° C. or higher for 0.1 to 12 hours, whereby the element such as nickel is gettered, the dopants are activated, and the crystal structure having been damaged in the ion-doping steps is restored.

After the heat treatment, contact holes are formed, and a metal film is formed. The substrate is further subjected to heat treatment, then a silicide is formed around the exposed high-concentration dopant region, and the metal film is removed. In the step of forming the protective film, a silicide may be or may not be formed.

The subsequent steps are the same as those in Example 1, and are not described herein. The technique of this Example may be combined with that of Examples 2 to 5.

EXAMPLE 7

The device of this Example is specifically modified so as to ensure good ohmic contact in interconnections, as in FIG. 10. The basic structure of the pixel matrix in the device is almost the same as that in Example 1. The difference between the structure of this Example and that of Example 1 is described herein.

In the same manner as in Example 1, an active layer and a gate insulation film are formed over a substrate having an insulation surface. On the film of the same material as that of the gate insulation film in the TFT in the pixel matrix, formed are a layer 1001 consisting essentially of tantalum, and a layer 1002 of a metallic material consisting essentially of titanium, in that order in a continuous film-forming manner. In this Example, the layer 1002 is of a titanium nitride film having a thickness of from 20 nm to 100 nm. The two layers 1001 and 1002 are patterned to give a multi-layered interconnection. After this, an interlayer insulating film is formed and a contact hole is formed, all in the same manner as in Example 1.

The titanium-based layer 1002 protects the tantalum-based layer 1001 from being oxidized or from absorbing hydrogen while a contact hole is formed. While a contact hole is formed, the titanium-based layer 1002 will be partly removed with the interlayer insulation film. However, even when the surface of the layer 1002 is reacted with oxygen, the layer 1002 does not give an insulator, and etching the layer 1002 is easy. Therefore, the two-layered film ensures good ohmic contact. Specifically, the titanium-based layer protects the tantalum-based layer, and, in addition, has an etching margin satisfactorily. Therefore, forming contact holes is easy. After a contact hole has been formed, an interconnection 1003 is formed and connected with the multi-layered interconnection composed of the layers 1001 and 1002, via the contact hole. After this, the substrate is processed in the same manner as in Example 1, and a device of FIG. 10 is obtained.

In place of the titanium-based layer, also employable is any layer consisting essentially of one element selected from Cr, Mn, Co, Ni, Cu, Mo and W.

The technique of this Example may be combined with that of Examples 2 to 5.

EXAMPLE 8

Figure 11A:
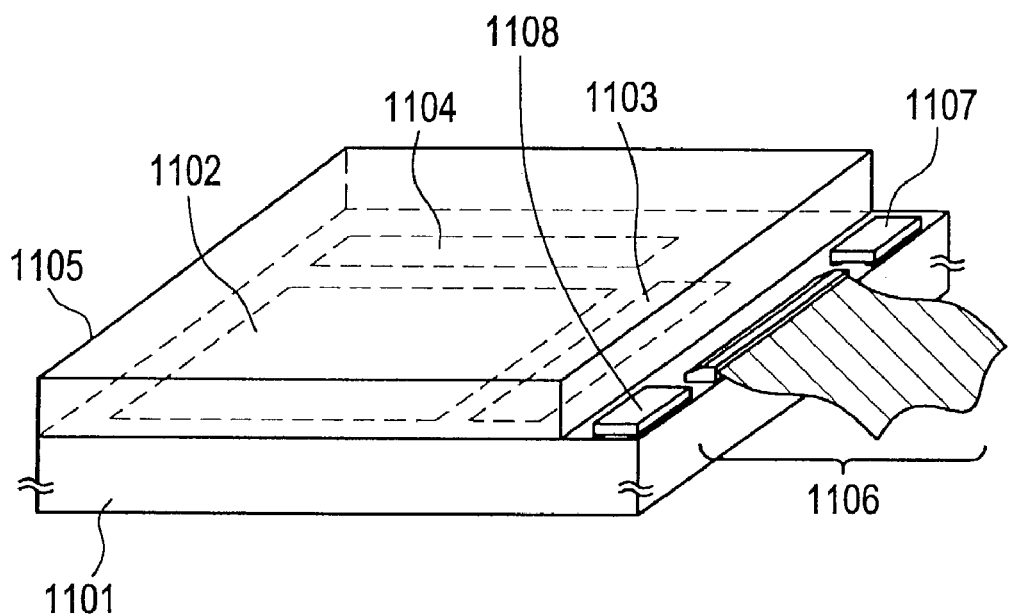
FIG. 11A and FIG. 11B are perspective views showing the outward appearance of active matrix liquid crystal displays.
Figure 11B:
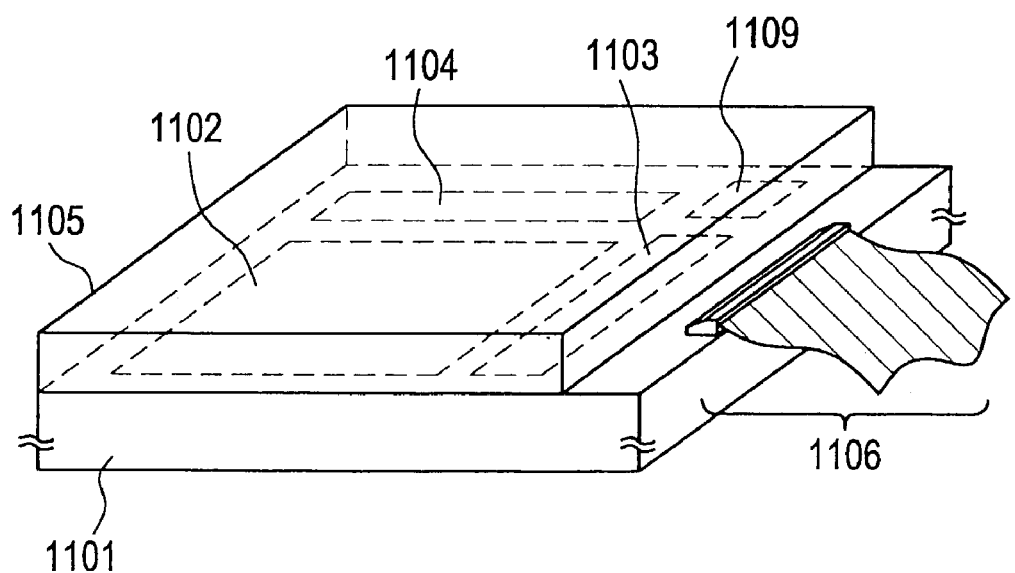

This is to illustrate AMLCDs comprising a TFT substrate (on which are mounted semiconductor units) of Examples 1 to 7. FIG. 11A and FIG. 11B are perspective views showing the outward appearance of active matrix liquid crystal displays (AMLCDs).

In FIG. 11A, 1101 is a substrate, over which are formed a pixel matrix 1102, a source-side driving circuit 1103 and a gate-side driving circuit 1104. The pixel matrix corresponds to FIG. 6A and FIG. 1, and a part of it is illustrated herein. The driving circuit corresponds to FIG. 6B and FIG. 1, and a part of it is illustrated. As illustrated, it is desirable that the driving circuit is a CMOS circuit where the N-type TFT and P-type TFT are combined in a complementary manner. 1105 is a counter substrate.

AMLCD of FIG. 11A comprises a substrate 1101 and a counter substrate 1105 put together with their edges being trued up, in which, however, the counter substrate 1105 is partly removed, and an FPC (flexible printed circuit) 1106 is connected with an exposed portion of the substrate 1101. Via the FPC 1106, external signals enter the circuit.

On the space of the surface of the exposed active matrix substrate 1101 with which the FPC 1106 is connected, mounted are IC chips 1107 and 1108. These IC chips comprise various circuits, such as video signal processing circuits, timing pulse generation circuits, gamma-correction circuits, memory circuits, arithmetic circuits and others as formed on silicon substrates. The device of FIG. 11A is drawn to have two IC chips, but the number of IC chips to be in AMLCD is not specifically defined. AMLCD may have one or more IC chips.

FIG. 11B is another embodiment of AMLCD. In FIG. 11A and FIG. 11B, the same parts are designated by the same numeral references. In the device of FIG. 11B, signal processing is effected in a logic circuit 1109 of TFTs as integrally mounted on the substrate 1101; while in the device of FIG. 11A, it is effected in the IC chips as separately mounted on the exposed area of the substrate 1101. In the device of FIG. 11B, the logic circuit is also based on a CMOS circuit, like the driving circuits 1103 and 1104.

A color filter may be combined with those AMLCDs for color display. Alternatively, the liquid-crystal materials may be driven in an ECB (electric control birefringence) mode or a GH (guest-host) mode in the absence of a color filter.

EXAMPLE 9

The CMOS circuit and the pixel matrix to which the invention is applied can be used in various electro-optical devices (active matrix-type liquid crystal displays, active matrix-type electroluminescence displays, active matrix-type electrochromic displays, etc.). The invention is applicable to all electronic appliances incorporating those electro-optical devices as display media.

The electronic appliances include video cameras, digital cameras, projectors (rear-type or front-type), head-mount displays (goggle-type displays), car navigators, personal computers, portable information terminals (mobile computers, portable telephones, electronic books, etc.). Some of their examples are shown in FIGS. 12A to 12F and FIGS. 13A to 13D.

Figure 12A:
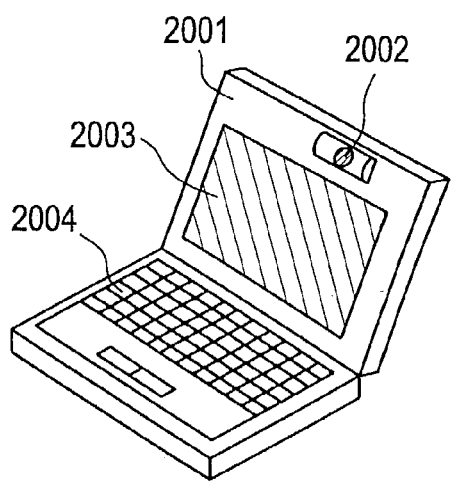
FIG. 12A to FIG. 12F are to show electronic appliances.

FIG. 12A is a personal computer, which comprises a body 2001, an image-inputting unit 2002, a display device 2003, and a key board 2004. The present invention is applied to the image-inputting unit 2002, the display device 2003 and other signal control circuits.

Figure 12B:
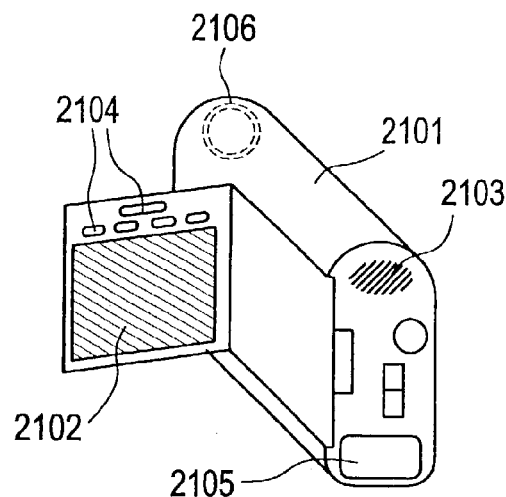

FIG. 12B is a video camera, which comprises a body 2101, a display device 2102, a voice-inputting unit 2103, a control switch 2104, a battery 2105, and an image-receiving unit 2106. The invention is applied to the display device 2102, the voice-inputting unit 2103 and other signal control circuits.

Figure 12C:
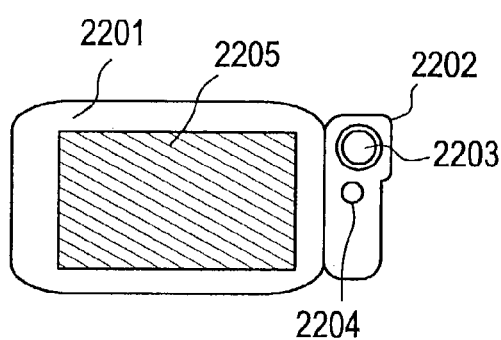

FIG. 12C is a mobile computer, which comprises a body 2201, a camera unit 2202, an image-receiving unit 2203, a control switch 2204, and a display device 2205. The invention is applied to the display device 2205 and other signal control circuits.

Figure 12D:
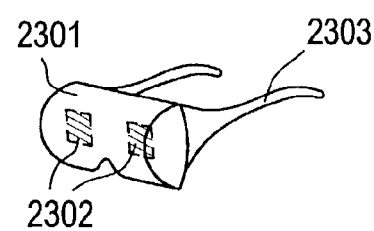

FIG. 12D is a goggle-type display, which comprises a body 2301, a display device 2302, and an arm 2303. The invention is applied to the display device 2302 and other signal control circuits.

Figure 12E:
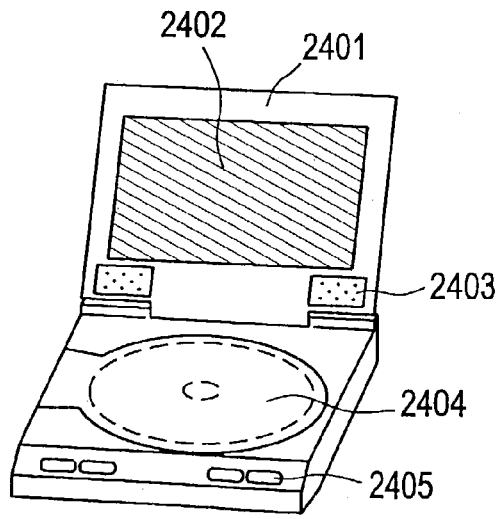

FIG. 12E is a player incorporating a recording medium on which is recorded a program (hereinafter referred to as a recording medium), which comprises a body 2401, a display device 2402, a speaker 2403, a recording medium 2404, and a control switch 2405. This device incorporates DVD (digital versatile disc), CD or the like serving as a recording medium, and is used for listening music, watching films, playing games and computing internets. The invention is applied to the display device 2402 and other signal control circuits.

Figure 12F:
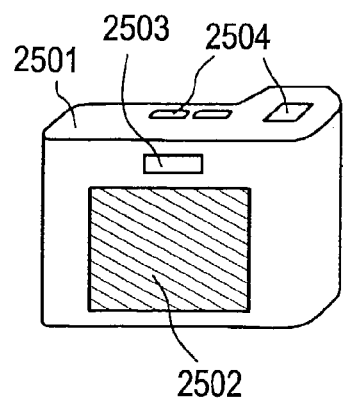

FIG. 12F is a digital camera, which comprises a body 2501, a display device 2502, an eyepiece 2503, a control switch 2504, and an image-receiving unit (not shown). The invention is applied to the display panel 2502 and other signal control circuits.

Figure 13A:
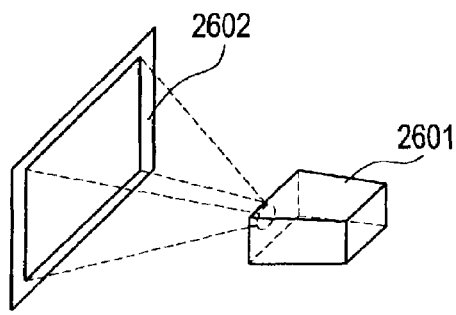
FIG. 13A to FIG. 13D are to show electronic appliances.

FIG. 13A is a front-type projector, which comprises a display device 2601 and a screen 2602. The invention is applied to the display device and other signal control circuits.

Figure 13B:
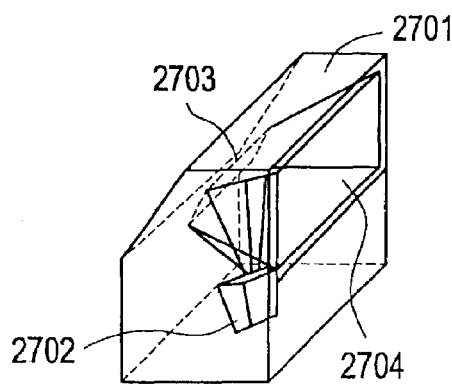

FIG. 13B is a rear-type projector, which comprises a body 2701, a display device 2702, a mirror 2703, and a screen 2704. The invention is applied to the display device and other signal control circuits.

Figure 13C:
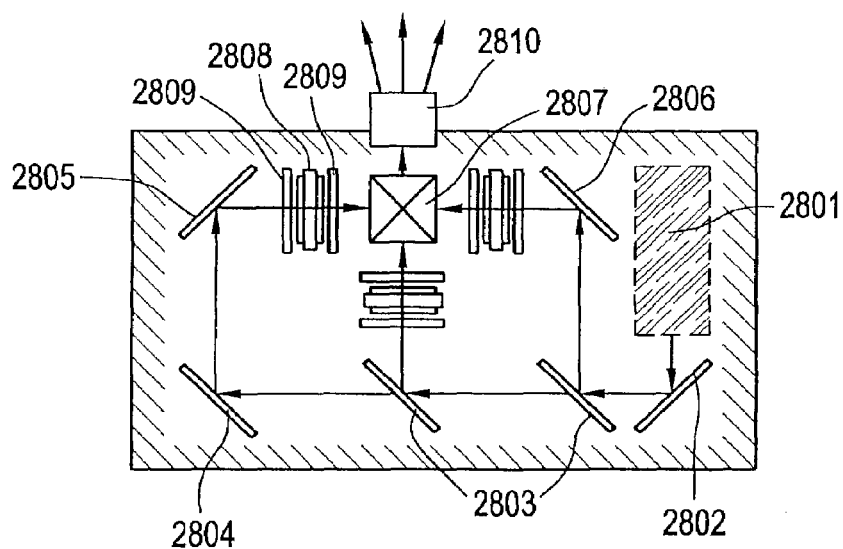

FIG. 13C shows one example of the structure of display devices 2601 and 2702 in FIG. 13A and FIG. 13B. The display devices 2601 and 2702 comprise an optical light source system 2801, mirrors 2802, and 2804 to 2806, a dichroic mirror 2803, a prism 2807, a liquid-crystalline display unit 2808, a phase difference plate 2809, and an optical projector system 2810. The optical projector system comprises a projection lens. The embodiment illustrated herein is of a three-plate system, which, however, is not limitative. Apart from the illustrated one, a single-plate system is also employable. In the structure of FIG. 13C, operators may suitably dispose any additional optical units of optical lenses, polarizing films, phase difference control films, IR films and others in the light pathways as indicated by the arrows.

Figure 13D:
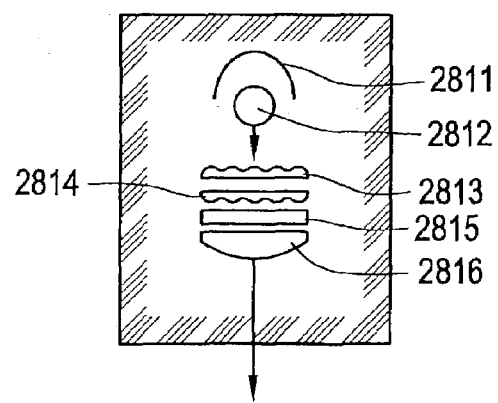

FIG. 13D shows one example of the structure of the optical light source system 2801 in FIG. 13C. The optical light source system 2801 illustrated comprises a reflector 2811, light source units 2812, 2813 and 2814, a polarizing and transforming element 2815, and a collector lens 2816. The example of the optical light source system of FIG. 13D is not limitative. As the case may be, operators may suitably dispose any additional optical units of optical lenses, polarizing films, phase difference control films, IR films and others in the optical light source system.

As in the above, the technical field to which the invention is applicable is extremely broad, and the invention is applicable to all types of electronic appliances. Apart from the embodiments illustrated herein, the invention is applicable to lighting notice boards, advertisement displays, etc. The electronic appliances referred to in this Example could be realized by any combinations of Examples 1 to 8.

According to the invention, thin film transistors having different characteristics can be integrated on one and the same substrate, for which increasing the working steps is not needed. The invention provides a peripheral driving circuit-integrated, active matrix-type liquid-crystalline display device, of which the total balance of the structure is good.

Concretely, in the semiconductor device as fabricated according to the invention, the circuit that is required to have high reliability, for example, the N-channel TFT circuit for the pixel matrix moiety comprises thin film transistor (TFT) units having the advantage of low OFF current.

On the other hand, in the peripheral driving circuit in the device, for example, in the CMOS circuit of N-channel TFTs therein, the thin film transistor (TFT) units have the advantage of high-speed operation. In addition, in the peripheral driving circuit in the device, for example, in the CMOS circuit of P-channel TFTs therein, the thin film transistor (TFT) units also have the advantage of high-speed operation.

The other advantage of the semiconductor device as fabricated according to the invention is that, even when the gate interconnections and electrodes (having a pattern line width of from 0.1 μm to 5 μm) are subjected to heat treatment at high temperatures (not lower than 400° C.), the device comprising them does not lose its good TFT characteristics.

Apart from its embodiments concretely illustrated herein, the invention is applicable to any other active matrix-type flat panel displays. For example, it is applicable to active matrix display devices incorporating EL units.

While the invention has been described in detail and with reference to specific embodiments thereof, it will be apparent to one skilled in the art that various changes and modifications can be made therein without departing from the spirit and scope thereof.

What is claimed is:

1. A method for manufacturing a semiconductor device comprising:
    forming first and second crystalline semiconductor films over a substrate having an insulation surface;
    forming a gate insulation film on said first and second crystalline semiconductor films;
    forming a first gate electrode over said first crystalline semiconductor film with said gate insulation film interposed therebetween and a second gate electrode over said second crystalline semiconductor film with said gate insulation film interposed therebetween;
    first doping an N-type impurity by using said first and second gate electrodes as masks;
    forming a protective film over said first and second gate electrodes and said gate insulation film;
    forming an insulation film over said protective film;
    forming a mask partly over said second gate electrode with said insulation film interposed therebetween;
    anisotropically etching said insulation film to form a side wall on a side surface of said first gate electrode, wherein said insulation film below said mask remains; and
    second doping said N-type impurity by using said side wall, said remained insulation film, and said first and second gate electrodes as masks, wherein an N-type impurity concentration of said second doping is higher than that of said first doping.

2. The method according to claim 1, wherein said first and second gate electrodes have a multi-layered structure, the step of forming said gate electrode comprising:
    forming a first layer containing tantalum and nitrogen;
    forming a second layer containing tantalum on said first layer; and
    forming a third layer containing tantalum and nitrogen on said second layer; and
    patterning said first, second, and third layer.

3. The method according to claim 1, wherein the step of forming said crystalline semiconductor film comprises:
    forming an amorphous semiconductor film over said substrate;
    adding an element for promoting crystallization to said amorphous semiconductor film; and
    crystallizing said amorphous semiconductor film by a heat treatment or laser irradiation.

4. The method according to claim 1, wherein said semiconductor device is incorporated into an electronic appliance selected from a group consisting of a personal computer, a video camera, a mobile computer, a goggle-type. display, a player, a digital camera, and a projector.

5. A method for manufacturing a semiconductor device including first and second thin film transistors comprising:
    forming first and second semiconductor films over a substrate;
    forming a gate insulation film on said first and second semiconductor films, respectively;
    forming first and second gate electrodes over said gate insulation film respectively;
    adding a first impurity element to said first and second semiconductor films by using said first and second gate electrodes as masks;
    forming a first insulation film over said first and second gate electrodes;
    partly forming a second insulation film on said first insulation film, wherein said second insulation film is located over said second gate electrode;
    etching said first insulation film, wherein a pair of side walls is formed on side surfaces of said first gate electrode, and said first insulation film below said second insulation film remains; and
    adding a second impurity element to said first and second semiconductor films by using said pair of side walls, said remained first insulation film, and first and second gate electrodes as masks, wherein said first insulation film remains over said second gate electrode after forming said pair of side walls.

6. The method according to claim 5, wherein said etching is conducted anisotropically.

7. The method according to claim 5, wherein said first and second gate electrodes have a multi-layered structure, the step of forming said first and second gate electrodes comprising:
- forming a first layer containing tantalum and nitrogen;
- forming a second layer containing tantalum on said first layer; and
- forming a third layer containing tantalum and nitrogen on said second layer; and
- patterning said first, second, and third layer.

8. The method according to claim 5, wherein said first and second semiconductor films comprise a crystalline semiconductor film, and the step of forming said crystalline semiconductor film comprises:
- forming an amorphous semiconductor film over said substrate;
- adding an element for promoting crystallization to said amorphous semiconductor film; and
- crystallizing said amorphous semiconductor film by a heat treatment or laser irradiation.

9. The method according to claim 5, wherein said semiconductor device is incorporated into an electronic appliance selected from a group consisting of a personal computer, a video camera, a mobile computer, a goggle-type display, a player, a digital camera, and a projector.

10. The method according to claim 5, wherein an LDD region, a source region and a drain region are formed in each of said first and second semiconductor films at said step of adding said second impurity element.

11. The method according to claim 5, wherein said first thin film transistor is used in a pixel portion and said second thin film transistor is used in a logic circuit.

12. A method for manufacturing a semiconductor device including first and second thin film transistors comprising:
- forming first and second semiconductor films over a substrate;
- forming a gate insulation film on said first and second semiconductor films, respectively;
- forming first and second gate electrodes over said gate insulation film, respectively;
- adding a first impurity element to said first and second semiconductor films by using said first and second gate electrodes as masks;
- forming a first insulation film over said first and second gate electrodes;
- partly forming a second insulation film on said first insulation film, wherein said second insulation film is located over said second gate electrode;
- etching said first insulation film, wherein a pair of side walls is formed on side surfaces of said first gate electrode, and said first insulation film below said second insulation film remains;
- adding a second impurity element to said first and second semiconductor films by using said pair of side walls, said remained first insulation film, and first and second gate electrodes as masks; and
- removing said second insulation film formed over said first insulation film after adding said second impurity element.

13. The method according to claim 12, wherein said etching is conducted anisotropically.

14. The method according to claim 12, wherein said first and second gate electrodes have a multi-layered structure, the step of forming said first and second gate electrodes comprising:
- forming a first layer containing tantalum and nitrogen;
- forming a second layer containing tantalum on said first layer; and
- forming a third layer containing tantalum and nitrogen on said second layer; and
- patterning said first, second, and third layer.

15. The method according to claim 12, wherein said first and second semiconductor films comprise a crystalline semiconductor film, and the step of forming said crystalline semiconductor film comprises:
- forming an amorphous semiconductor film over said substrate;
- adding an element for promoting crystallization to said amorphous semiconductor film; and
- crystallizing said amorphous semiconductor film by a heat treatment or laser irradiation.

16. The method according to claim 12, wherein said semiconductor device is incorporated into an electronic appliance selected from a group consisting of a personal computer, a video camera, a mobile computer, a goggle-type display, a player, a digital camera, and a projector.

17. The method according to claim 12, wherein an LDD region, a source region and a drain region are formed in each of said first and second semiconductor films at said step of adding said second impurity.

18. The method according to claim 12, wherein said first thin film transistor is used in a pixel portion and said second thin film transistor is used in a logic circuit.

19. A method for manufacturing a semiconductor device including first and second thin film transistors comprising:
- forming first and second semiconductor films over a substrate;
- forming a gate insulation film on said first and second semiconductor films, respectively;
- forming first and second gate electrodes over said gate insulation film respectively;
- adding a first impurity element to said first and second semiconductor films by using said first and second gate electrodes as masks;
- forming an insulating layer over said first and second gate electrodes and said gate insulation film;
- forming a first insulation film over said first and second gate electrodes with said insulating layer interposed therebetween;
- partly forming a second insulation film on said first insulation film, wherein said second insulation film is located over said second gate electrode;
- etching said first insulation film, wherein a pair of side walls is formed on side surfaces of said first gate electrode, and said first insulation film below said second insulation film remains; and
- adding a second impurity element to said first and second semiconductor films by using said pair of side walls, said remained first insulation film, and first and second gate electrodes as masks,
- wherein said first insulation film remains over said second gate electrode after forming said pair of side walls.

20. The method according to claim 19, wherein said etching is conducted anisotropically.

21. The method according to claim 19, wherein said first and second gate electrodes have a multi-layered structure, the step of forming said first and second gate electrodes comprising:

forming a first layer containing tantalum and nitrogen;
forming a second layer containing tantalum on said first layer; and
forming a third layer containing tantalum and nitrogen on said second layer; and
patterning said first, second, and third layer.

22. The method according to claim 19, wherein said first and second semiconductor films comprise a crystalline semiconductor film, and the step of forming said crystalline semiconductor film comprises:
forming an amorphous semiconductor film over said substrate;
adding an element for promoting crystallization to said amorphous semiconductor film; and
crystallizing said amorphous semiconductor film by a heat treatment or laser irradiation.

23. The method according to claim 19, wherein said semiconductor device is incorporated into an electronic appliance selected from a group consisting of a personal computer, a video camera, a mobile computer, a goggle-type display, a player, a digital camera, and a projector.

24. The method according to claim 19, wherein an LDD region, a source region and a drain region are formed in each of said first and second semiconductor films at said step of adding said first impurity.

25. The method according to claim 19, wherein said first thin film transistor is used in a pixel portion and said second thin film transistor is used in a logic circuit.

26. A method for manufacturing a semiconductor device including first and second thin film transistors comprising:
forming first and second semiconductor films over a substrate;
forming a gate insulation film on said first and second semiconductor films, respectively;
forming first and second gate electrodes over said gate insulation film, respectively;
adding a first impurity element to said first and second semiconductor films by using said first and second gate electrodes as masks;
forming a first insulation film over said first and second gate electrodes;
partly forming a second insulation film on said first insulation film, wherein said second insulation film is located over said second gate electrode;
etching said first insulation film by using said second insulation film as a mask, wherein a pair of side walls is formed on side surfaces of said first gate electrode, and wherein said first insulation film below said second insulation film remains; and
adding a second impurity element to said first and second semiconductor films by using said pair of side walls, said remained first insulation film, and first and second gate electrodes as masks.

27. The method according to claim 26, wherein said etching is conducted anisotropically.

28. The method according to claim 26, wherein said first and second gate electrodes have a multi-layered structure, the step of forming said first and second gate electrodes comprising:
forming a first layer containing tantalum and nitrogen;
forming a second layer containing tantalum on said first layer; and
forming a third layer containing tantalum and nitrogen on said second layer; and
patterning said first, second, and third layer.

29. The method according to claim 26, wherein said first and second semiconductor films comprise a crystalline semiconductor film, and the step of forming said crystalline semiconductor film comprises:
forming an amorphous semiconductor film over said substrate;
adding an element for promoting crystallization to said amorphous semiconductor film; and
crystallizing said amorphous semiconductor film by a heat treatment or laser irradiation.

30. The method according to claim 26, wherein said semiconductor device is incorporated into an electronic appliance selected from a group consisting of a personal computer, a video camera, a mobile computer, a goggle-type display, a player, a digital camera, and a projector.

31. The method according to claim 26, wherein an LDD region, a source region and a drain region are formed in each of said first and second semiconductor films at said step of adding said first impurity.

32. The method according to claim 26, wherein said first thin film transistor is used in a pixel portion and said second thin film transistor is used in a logic circuit.

33. A method for manufacturing a semiconductor device including first and second thin film transistors comprising:
forming first and second semiconductor films over a substrate;
forming a gate insulation film on said first and second semiconductor films, respectively;
forming first and second gate electrodes over said gate insulation film, respectively;
adding a first impurity element to said first and second semiconductor films by using said first and second gate electrodes as masks;
forming a protective film over said first and second gate electrodes and said gate insulation film;
forming a first insulation film over said first and second gate electrodes with said protective film interposed therebetween;
partly forming a second insulation film on said first insulation film, wherein said second insulation film is located over said second gate electrode;
etching said first insulation film by using said second insulation film as a mask, wherein a pair of side walls is formed on side surfaces of said first gate electrode, and wherein said first insulation film below said second insulation film remains; and
adding a second impurity element to said first and second semiconductor films by using said pair of side walls, said remained first insulation film, and first and second gate electrodes as masks.

34. The method according to claim 33, wherein said etching is conducted anisotropically.

35. The method according to claim 33, wherein said first and second gate electrodes have a multi-layered structure, the step of forming said first and second gate electrodes comprising:
forming a first layer containing tantalum and nitrogen;
forming a second layer containing tantalum on said first layer; and
forming a third layer containing tantalum and nitrogen on said second layer; and
patterning said first, second, and third layer.

36. The method according to claim 33, wherein said first and second semiconductor films comprise a crystalline semiconductor film, and the step of forming said crystalline semiconductor film comprises:
forming an amorphous semiconductor film over said substrate;

adding an element for promoting crystallization to said amorphous semiconductor film; and crystallizing said amorphous semiconductor film by a heat treatment or laser irradiation.

37. The method according to claim 33, wherein said semiconductor device is incorporated into an electronic appliance selected from a group consisting of a personal computer, a video camera, a mobile computer, a goggle-type display, a player, a digital camera, and a projector.

38. The method according to claim 33, wherein an LDD region, a source region and a drain region are formed in each of said first and second semiconductor films at said step of adding said first impurity.

39. The method according to claim 33, wherein said first thin film transistor is used in a pixel portion and said second thin film transistor is used in a logic circuit.

* * * * *